United States Patent
Iwai et al.

(10) Patent No.: US 12,058,854 B2
(45) Date of Patent: Aug. 6, 2024

(54) THREE-DIMENSIONAL MEMORY DEVICE WITH ISOLATED SOURCE STRIPS AND METHOD OF MAKING THE SAME

(71) Applicant: SANDISK TECHNOLOGIES LLC, Addison, TX (US)

(72) Inventors: Takaaki Iwai, Yokkaichi (JP); Akio Nishida, Yokkaichi (JP); Masanori Tsutsumi, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 316 days.

(21) Appl. No.: 17/232,209

(22) Filed: Apr. 16, 2021

(65) Prior Publication Data
US 2022/0336484 A1 Oct. 20, 2022

(51) Int. Cl.
*H10B 41/27* (2023.01)
*G11C 8/14* (2006.01)
*H10B 41/10* (2023.01)
*H10B 41/35* (2023.01)
*H10B 41/40* (2023.01)
(Continued)

(52) U.S. Cl.
CPC ............ *H10B 41/27* (2023.02); *G11C 8/14* (2013.01); *H10B 41/10* (2023.02); *H10B 41/35* (2023.02); *H10B 41/40* (2023.02); *H10B 43/10* (2023.02); *H10B 43/27* (2023.02); *H10B 43/35* (2023.02); *H10B 43/40* (2023.02)

(58) Field of Classification Search
CPC ........ H10B 41/27; H10B 41/10; H10B 41/35; H10B 41/40; H10B 43/27; H10B 43/10; H10B 43/35; H10B 43/40; G11C 7/14; G11C 8/14; H01L 21/76855; H01L 21/76858
See application file for complete search history.

(56) References Cited

U.S. PATENT DOCUMENTS 5,915,167 A 6/1999 Leedy
8,847,302 B2 9/2014 Alsmeier et al.
(Continued)

OTHER PUBLICATIONS

U.S. Appl. No. 16/582,262, filed Sep. 25, 2019, SanDisk Technologies LLC.
(Continued)

*Primary Examiner* — Alia Sabur
(74) *Attorney, Agent, or Firm* — THE MARBURY LAW GROUP PLLC

(57) ABSTRACT

A memory die includes source-select-level electrically conductive strips laterally spaced apart by source-select-level dielectric isolation structures, an alternating stack of word-line-level electrically conductive layers and insulating layers; and source strips located on an opposite side of the source-select-level electrically conductive strips. Each of the source strips has an areal overlap with only a respective one of the source-select-level electrically conductive strips. Memory stack structures vertically extend through the alternating stack and a respective subset of the source-select-level electrically conductive strips. A logic die may be bonded to the memory die on an opposite side of the source strips. Each source strip is electrically connected to a respective group of memory stack structures laterally surrounded by a respective source-select-level electrically conductive strip.

20 Claims, 36 Drawing Sheets

(51) Int. Cl.
*H10B 43/10* (2023.01)
*H10B 43/27* (2023.01)
*H10B 43/35* (2023.01)
*H10B 43/40* (2023.01)

(56) References Cited

U.S. PATENT DOCUMENTS

| | | | |
|---|---|---|---|
| 9,721,965 B2* | 8/2017 | Yun | H10B 43/27 |
| 10,050,054 B2 | 8/2018 | Zhang et al. | |
| 10,083,982 B2* | 9/2018 | Shigemura | H01L 21/31111 |
| 10,256,247 B1 | 4/2019 | Kanakamedala et al. | |
| 10,276,583 B2 | 4/2019 | Sharangpani et al. | |
| 10,283,493 B1 | 5/2019 | Nishida | |
| 10,347,654 B1 | 7/2019 | Iwai et al. | |
| 10,381,362 B1 | 8/2019 | Cui et al. | |
| 10,453,798 B2* | 10/2019 | Tsutsumi | H10B 43/50 |
| 10,510,738 B2 | 12/2019 | Kim et al. | |
| 10,615,172 B2 | 4/2020 | Nagata et al. | |
| 10,714,497 B1* | 7/2020 | Nishida | H01L 21/76802 |
| 10,847,524 B2 | 11/2020 | Otsu et al. | |
| 10,923,498 B2 | 2/2021 | Otsu et al. | |
| 11,201,107 B2* | 12/2021 | Okina | H01L 24/08 |
| 2013/0264631 A1 | 10/2013 | Alsmeier et al. | |
| 2016/0268209 A1* | 9/2016 | Pachamuthu | H01L 29/40117 |
| 2017/0243651 A1* | 8/2017 | Choi | G11C 16/16 |
| 2018/0033646 A1 | 2/2018 | Sharangpani et al. | |
| 2018/0331118 A1* | 11/2018 | Amano | H01L 21/76856 |
| 2018/0366486 A1 | 12/2018 | Hada et al. | |
| 2019/0164983 A1* | 5/2019 | Hu | H10B 41/35 |
| 2019/0221557 A1 | 7/2019 | Kim et al. | |
| 2019/0280103 A1* | 9/2019 | Chen | H10B 43/50 |
| 2019/0348435 A1 | 11/2019 | Nagata et al. | |
| 2020/0020713 A1* | 1/2020 | Choi | H10B 43/35 |
| 2020/0185402 A1* | 6/2020 | Son | H10B 43/10 |
| 2020/0328181 A1* | 10/2020 | Liu | H01L 24/08 |
| 2021/0225872 A1* | 7/2021 | Sun | H10B 43/10 |
| 2022/0068317 A1* | 3/2022 | Fukuzumi | H10B 43/10 |
| 2022/0068955 A1* | 3/2022 | King | H10B 41/10 |
| 2022/0077182 A1* | 3/2022 | Lee | H10B 43/27 |
| 2022/0139943 A1* | 5/2022 | Go | H10B 43/35 257/314 |
| 2022/0336484 A1* | 10/2022 | Iwai | H10B 43/40 |

OTHER PUBLICATIONS

U.S. Appl. No. 16/735,854, filed Jan. 7, 2020, SanDisk Technologies LLC.
U.S. Appl. No. 16/809,861, filed Mar. 5, 2020, SanDisk Technologies LLC.
U.S. Appl. No. 16/916,476, filed Jun. 30, 2020, SanDisk Technologies LLC.
U.S. Appl. No. 16/951,325, filed Nov. 18, 2020, SanDisk Technologies LLC.
U.S. Appl. No. 16/951,354, filed Nov. 18, 2020, SanDisk Technologies LLC.
U.S. Appl. No. 17/038,870, filed Sep. 30, 2020, SanDisk Technologies LLC.
U.S. Appl. No. 17/085,735, filed Oct. 30, 2020, SanDisk Technologies LLC.
U.S. Appl. No. 17/106,792, filed Nov. 30, 2020, SanDisk Technologies LLC.
U.S. Appl. No. 17/122,296, filed Dec. 15, 2020, SanDisk Technologies LLC.
U.S. Appl. No. 17/155,512, filed Jan. 22, 2021, SanDisk Technologies LLC.
U.S. Appl. No. 17/166,393, filed Feb. 3, 2021, SanDisk Technologies LLC.
U.S. Appl. No. 17/174,064, filed Feb. 11, 2021, SanDisk Technologies LLC.
U.S. Appl. No. 17/174,094, filed Feb. 11, 2021, SanDisk Technologies LLC.
ISR—Notification of Transmittal of The International Search Report and Written Opinion of the International Searching Authority for International Patent Application No. PCT/US2022/012620, mailed Apr. 28, 2022, 9 pages.

* cited by examiner

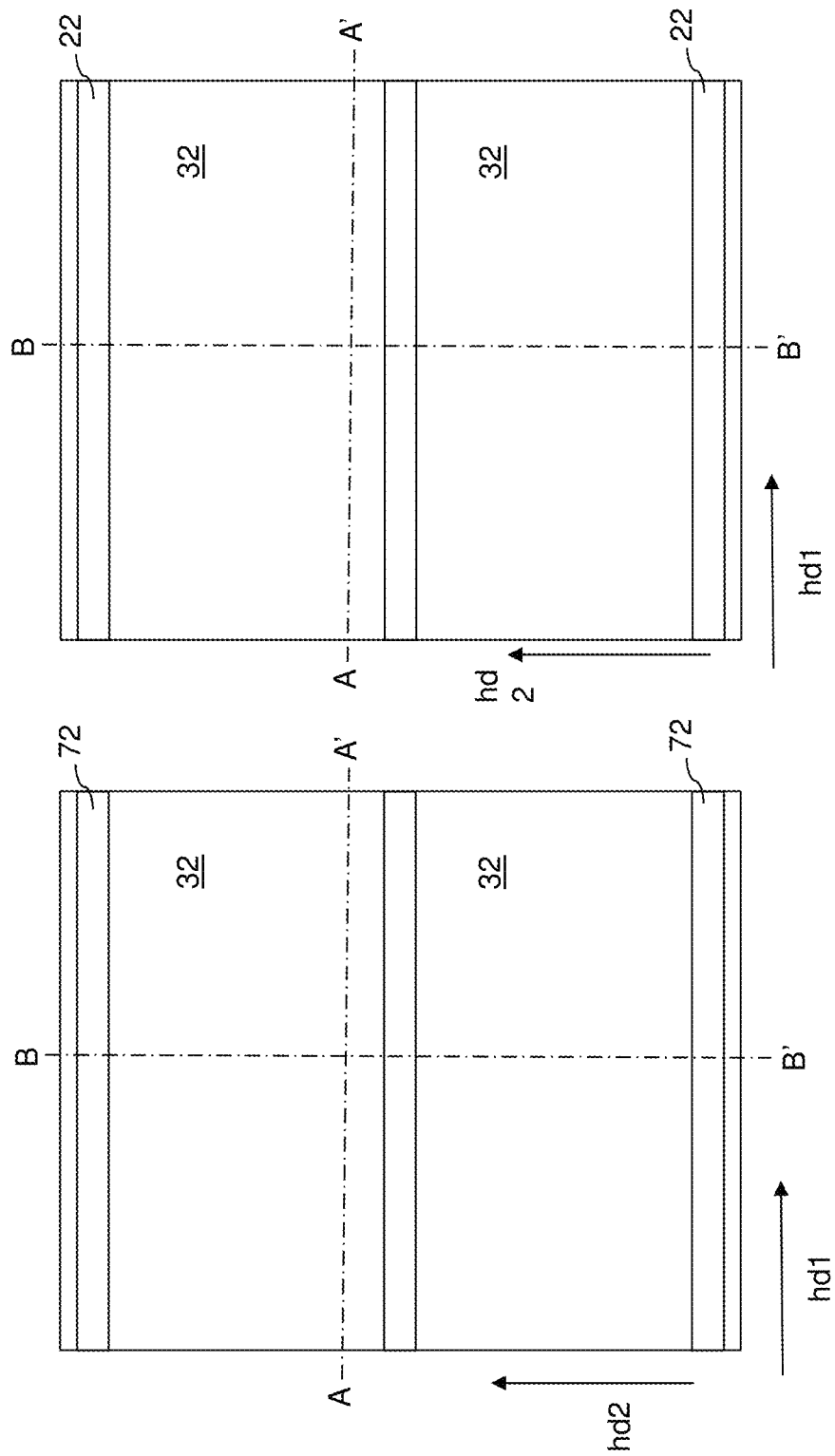

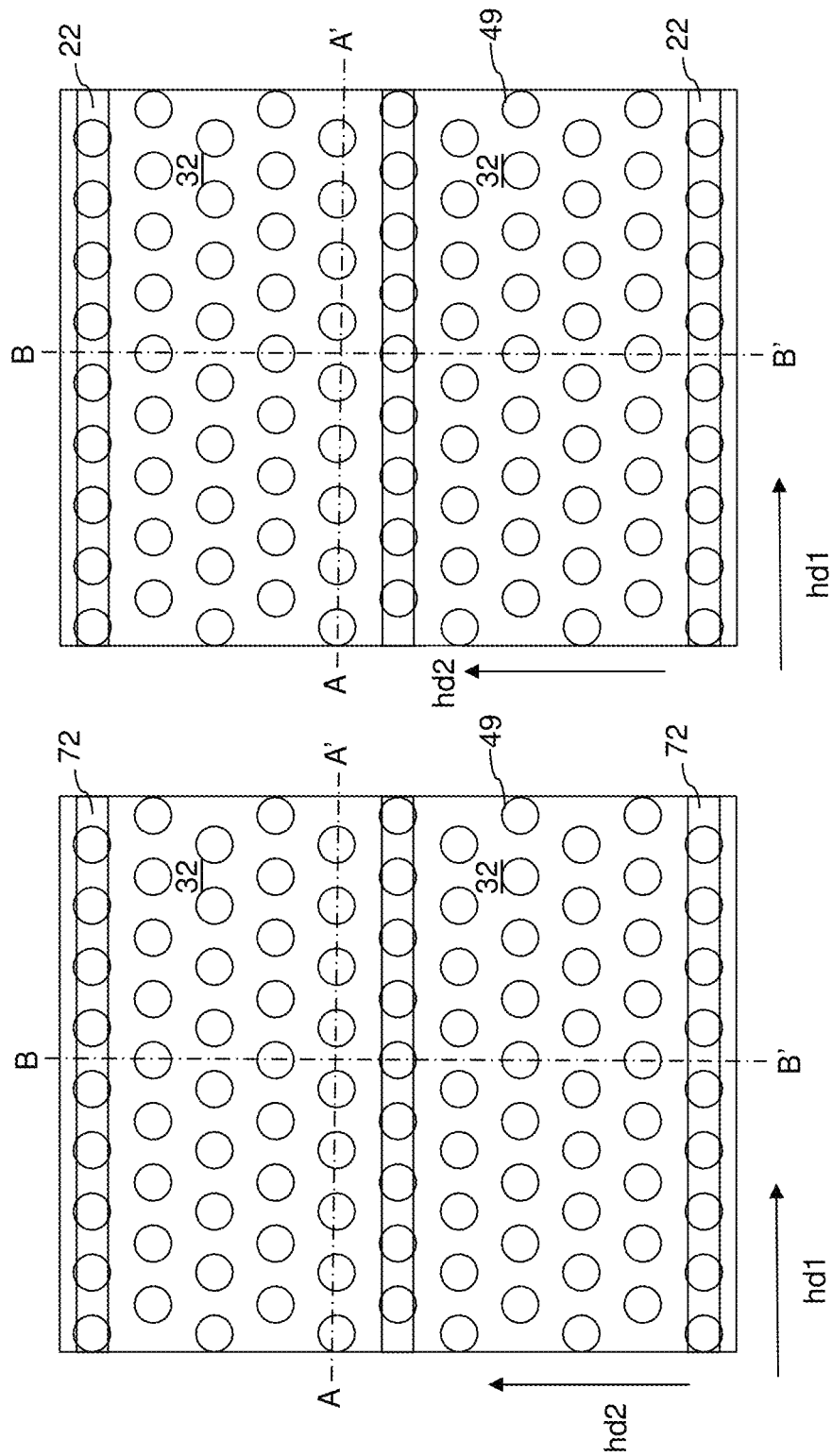

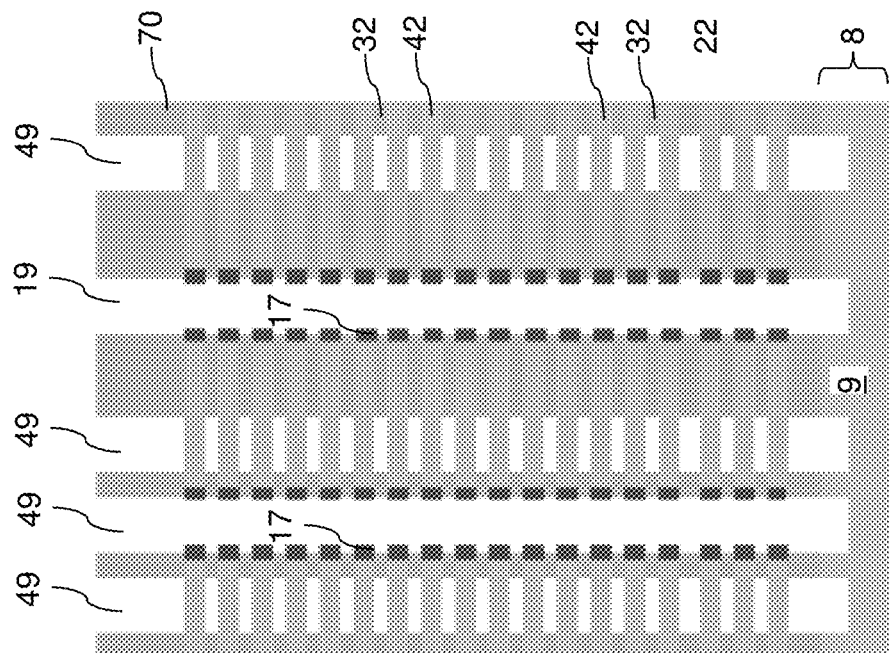
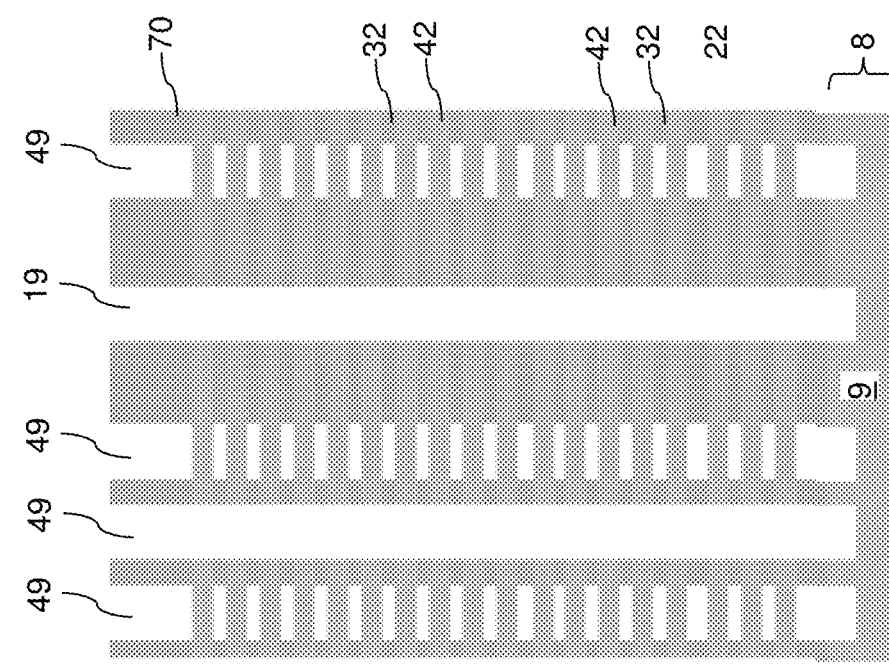
FIG. 4A
FIG. 4B

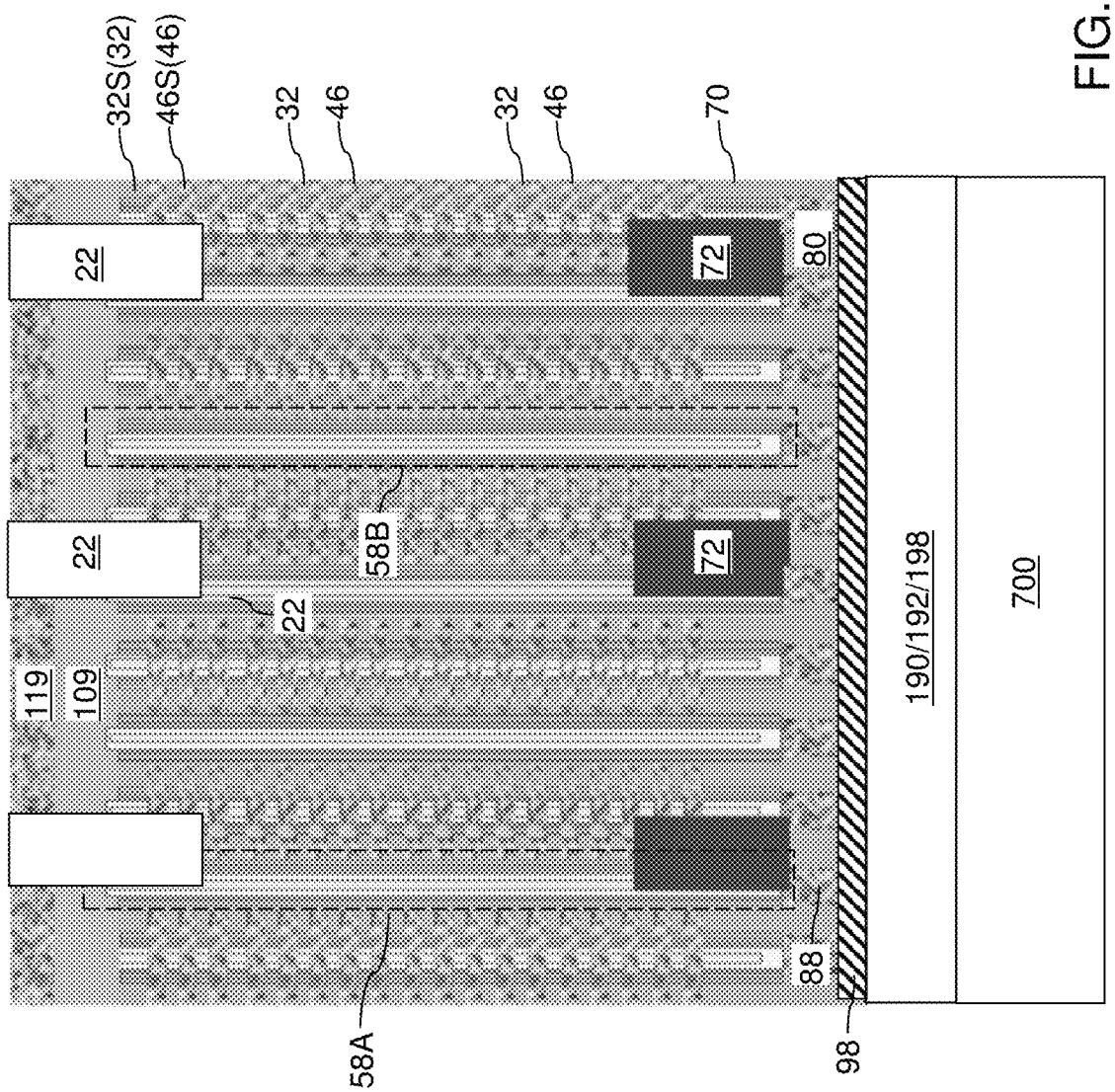

THREE-DIMENSIONAL MEMORY DEVICE WITH ISOLATED SOURCE STRIPS AND METHOD OF MAKING THE SAME

FIELD

The present disclosure relates generally to the field of semiconductor devices and specifically to a three-dimensional memory device containing isolated source strips and methods of making the same.

BACKGROUND

Recently, ultra-high-density storage devices employing three-dimensional (3D) memory stack structures have been proposed. Such memory stack structures can employ an architecture known as Bit Cost Scalable (BiCS) architecture. For example, a 3D NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a vertical stack of memory elements and a vertical semiconductor channel.

SUMMARY

According to an aspect of the present disclosure, a semiconductor structure comprises a memory die. The memory die comprises source-select-level electrically conductive strips laterally extending along a first horizontal direction and laterally spaced apart along a second horizontal direction by source-select-level dielectric isolation structures, drain-select-level electrically conductive strips laterally extending along the first horizontal direction and laterally spaced apart along the second horizontal direction by drain-select-level dielectric isolation structures, an alternating stack of word-line-level electrically conductive layers and insulating layers located between the source-select-level electrically conductive strips and the drain-select-level electrically conductive strips, source strips, wherein each of the source strips has an areal overlap with a respective one of the source-select-level electrically conductive strips, and the source-select-level electrically conductive strips are located between the source strips and the alternating stack, and memory opening fill structures vertically extending through the alternating stack, the source-select-level electrically conductive strips and the drain-select-level electrically conductive strips, wherein each of the memory opening fill structures comprises a respective memory film, a respective drain region, and a respective vertical semiconductor channel having a source-side end contacting a respective source strip.

In one embodiment, each of the source strips does not have any areal overlap with any other of the source-select-level electrically conductive strips other than the respective one of the source-select-level electrically conductive strips. In one embodiment, the memory die comprises a memory plane containing first and second adjacent memory blocks, the adjacent first and second memory blocks are separated by a first one of the respective source-select-level dielectric isolation structures and a first one of the drain-select-level dielectric isolation structures areal that has an overlap with the first one of the source-select-level electrically conductive strips, and word-line-level electrically conductive layers extend continuously between the adjacent first and second memory blocks. In one embodiment, the memory die lacks trenches which extend along the first horizontal direction between the adjacent first and second memory blocks and which separate word-line-level electrically conductive layers of the adjacent memory blocks.

According to another aspect of the present disclosure, a three-dimensional memory device comprises a memory plane containing a first memory block and a second memory block located adjacent to the first memory block. The first memory block comprises at least one first source side select gate electrode, at least one first drain side select gate electrode, a plurality of word lines located between the at least one first source side select gate electrode and at least one first drain side select gate electrode, and a plurality of first vertical NAND strings extending through the at least one first source side select gate electrode, the plurality of word lines and the at least one first drain side select gate electrode. The second memory block comprises at least one second source side select gate electrode, at least one second drain side select gate electrode, the plurality of word lines located between the at least one second source side select gate electrode and at least one second drain side select gate electrode, and a plurality of second vertical NAND strings extending through the at least one second source side select gate electrode, the plurality of word lines and the at least one second drain side select gate electrode. The memory plane further comprises a source-select-level dielectric isolation structure located between the least one first source side select gate electrode and the least one second source side select gate electrode, and a drain-select-level dielectric isolation structure located between the least one first drain side select gate electrode and the least one second drain side select gate electrode, wherein the plurality of word lines extend continuously between the first memory block and the second memory block.

According to another aspect of the present disclosure, a method of forming a semiconductor structure is provided, which comprises: forming a vertical repetition of unit layer stacks including an insulating layer and a spacer material layer over a sacrificial substrate, wherein the spacer material layers are formed as or are subsequently replaced with electrically conductive layers; forming openings through the vertical repetition, wherein the openings comprise memory openings and boundary openings; forming a perforated trench by laterally recessing sidewalls of the spacer material layers around the boundary openings selective to the insulating layers, wherein a row of boundary openings merges at levels of the spacer material layers to form the perforated trench; formatting a perforated dielectric wall structure within the perforated trench; forming memory opening fill structures in the memory openings, wherein each of the memory opening fill structures comprises a memory film and a vertical semiconductor channel; replacing the sacrificial substrate with a source layer; dividing the source layer into source strips laterally extending along a first horizontal direction and laterally spaced apart along a second horizontal direction that is perpendicular to the first horizontal direction; and dividing a subset of the spacer material layers into source-select-level spacer material strips prior to formation of the memory openings or after dividing the source layer into the source strips.

BRIEF DESCRIPTION OF THE DRAWINGS

FIG. 1C is a horizontal cross-sectional view along the horizontal plane C-C' of FIG. 1B. The vertical planes A-A' and B-B' correspond to the vertical cross-sectional plane of FIGS. 1A and 1B, respectively.

FIG. 1D is a horizontal cross-sectional view along the horizontal plane D-D' of FIG. 1B. The vertical planes A-A' and B-B' correspond to the vertical cross-sectional plane of FIGS. 1A and 1B, respectively.

FIG. 3C is a horizontal cross-sectional view along the horizontal plane C-C' of FIG. 3B. The vertical planes A-A' and B-B' correspond to the vertical cross-sectional plane of FIGS. 3A and 3B, respectively.

FIG. 3D is a horizontal cross-sectional view along the horizontal plane D-D' of FIG. 3B. The vertical planes A-A' and B-B' correspond to the vertical cross-sectional plane of FIGS. 3A and 3B, respectively.

FIGS. 4A-4G are sequential vertical cross-sectional views of a periphery of a memory array region of the first exemplary structure during formation of a perforated dielectric wall structure according to the first embodiment of the present disclosure.

FIG. 4H is a see-through top-down view of the first exemplary structure of FIG. 4G. The vertical plane G-G' is the plane of the of the vertical cross-sectional view of FIG. 4G.

FIG. 23A is a vertical cross-sectional view of the second exemplary structure after dividing the metallic source layer and the semiconductor source layer and formation of source-select-level dielectric isolation structures according to the second embodiment of the present disclosure.

DETAILED DESCRIPTION

Figure 1A:
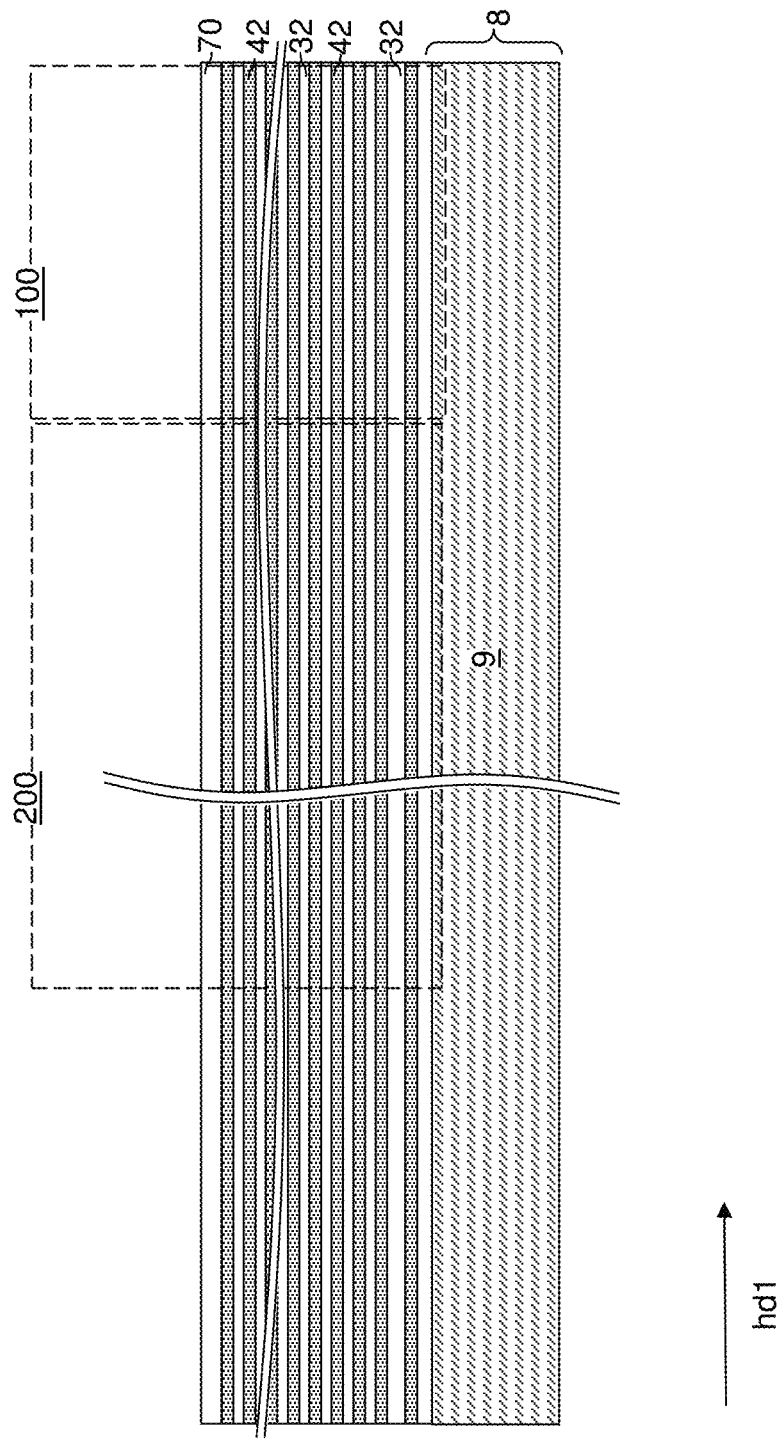
FIG. 1A is a vertical cross-sectional view of a first exemplary structure after formation of a vertical repetition of unit layer stacks over a sacrificial substrate according to a first embodiment of the present disclosure.

Electrical isolation structures, such as backside trenches, which electrically isolate adjacent memory blocks, take up a significant fraction of a memory device area in a three-dimensional memory array. Further, formation of the backside trenches typically requires an anisotropic etch process requiring a long etch time, and filling of the backside trenches may cause substrate warpage. Embodiments of the present disclosure provide an alternative device configuration in which the backside trenches are omitted, and source-side electrical isolation between various groups of memory elements is provided by a combination of source-select-level dielectric isolation structures and discrete source strips. Thus, word lines may extend through plural memory blocks in the same memory plane, and the source side and drain side select transistors are used to select a specific memory block in a memory plane. Various aspects of embodiments of the present disclosure are described below in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Referring to FIGS. 1A-1D, a first exemplary structure according to a first embodiment of the present disclosure is illustrated. The first exemplary structure comprises a sacrificial substrate 8, which includes a sacrificial substrate layer 9. The sacrificial substrate 8 may be a bulk semiconductor substrate (e.g., a silicon wafer) or a semiconductor-on-insulator (e.g., silicon-on-insulator) substrate. The sacrificial substrate layer 9 may comprise a doped semiconductor (e.g., silicon) well in the semiconductor substrate and/or a semiconductor layer deposited on the substrate 8. Alternatively, the sacrificial substrate 8 may be any other suitable sacrificial substrate.

A vertical repetition of unit layer stacks (32, 42) can be formed over the sacrificial substrate 8. The vertical repetition of unit layer stacks (32, 42) comprises a vertically stack of multiple instances of a unit layer stack (32, 42), which includes an insulating layer 32 and a spacer material layer 42. Thus, the vertical repletion of unit layer stacks (32, 42) can include, from bottom to top, a bottommost insulating layer 32, a bottommost spacer material layer 42, an insulating layer 32, a spacer material layer 42, another insulating layer 32, another spacer material layer 42, and so forth up to a topmost insulating layer 32 and a topmost spacer material layer 42. Each instance of the unit layer stack (32, 42) can include an identical vertical sequence of material layers such as an insulating layer 32 and a spacer material layer 42.

The insulating layers 32 within the vertical repetition (32, 42) includes an insulating material, i.e., a dielectric material. For example, the insulating layers 32 can include undoped silicate glass or a doped silicate glass. The thickness of each insulating layer 32 may be in a range from 15 nm to 50 nm, although lesser and greater thicknesses may also be employed.

The spacer material layers 42 can be formed as, or can be subsequently replaced with, electrically conductive layers. The thickness of each spacer material layer 42 may be in a range from 15 nm to 50 nm, although lesser and greater thicknesses may also be employed.

In case the spacer material layers 42 are formed as electrically conductive layers, the spacer material layers 42 may include metallic material layers including an elemental metal, an intermetallic alloy, a conductive metallic nitride, a conductive metallic carbide, or a conductive doped semiconductor material (such as heavily doped polysilicon or amorphous silicon).

In case the spacer material layers 42 are subsequently replaced with electrically conductive layers, the spacer material layers 42 may be formed as sacrificial material layers including a sacrificial material that can be removed selective to the material of the insulating layers 32, i.e., without significantly etching the material of the insulating layers 32. As used herein, an etch process etches a first material selective to a second material if the ratio of the etch rate of the first material to the etch rate of the second material is at least 2. The ratio of the two etch rates may be in a range from 10 to 1,000 depending on selection of the etchant for the etch process. In one embodiment, the sacrificial material layers (as embodied as the spacer material layers 42) may include silicon nitride or a semiconductor material (such as polysilicon or a silicon-germanium alloy).

In an alternative embodiment in which the spacer material layers 42 are formed as electrically conductive layers, the spacer material layers 42 may be formed as semiconductor material layers that can be subsequently metallized to form a metal-semiconductor alloy. For example, in case the spacer material layers 42 include a silicon-containing material (such as polysilicon or amorphous silicon), the metal-semiconductor alloy can be a metal silicide. In case the spacer material layers 42 include a silicon-germanium alloy, the metal-semiconductor alloy can be a metal germanide-silicide.

Figure 1B:
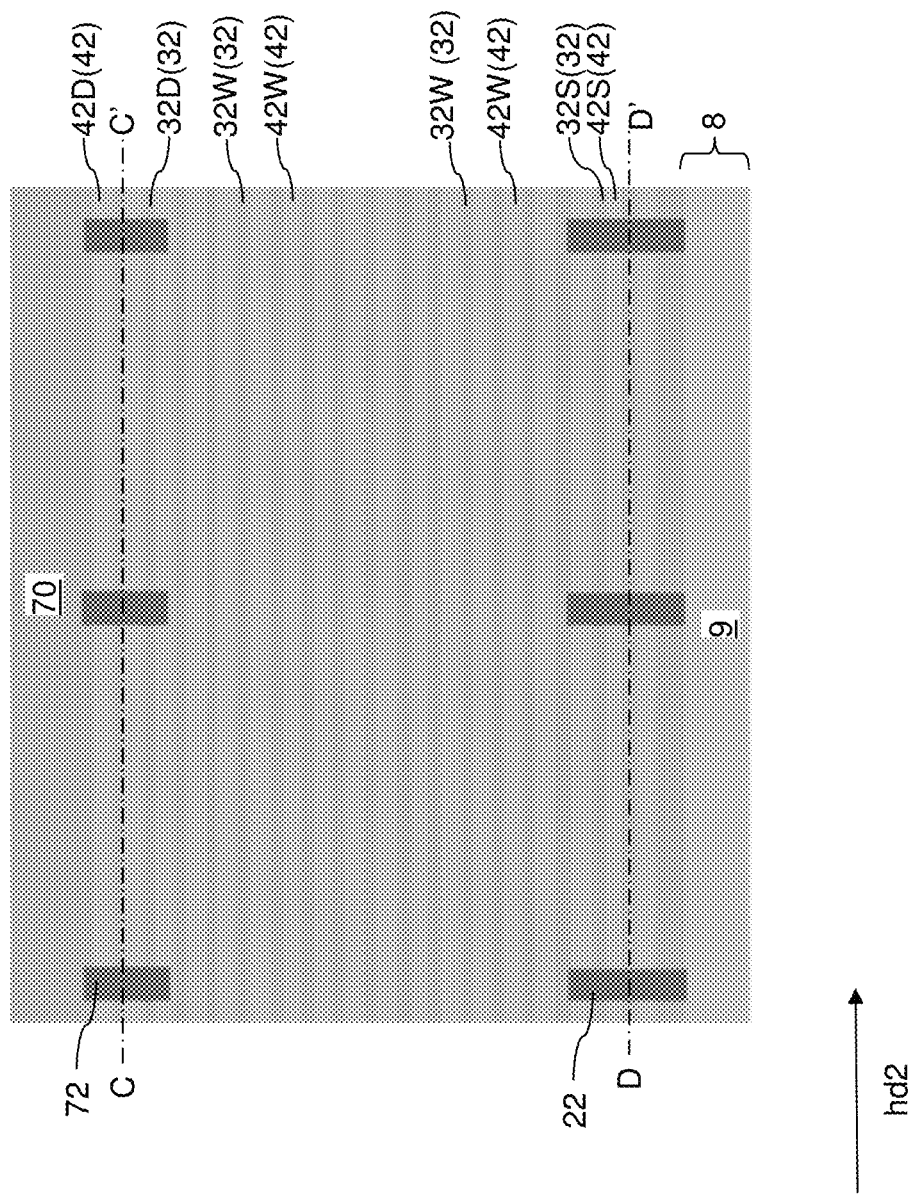
FIG. 1B is a vertical cross-sectional view of a memory array region of the first exemplary structure of FIG. 1A.

The spacer material layers 42 of the vertical repetition can include, from bottom to top, a first subset of the spacer material layers 42, a second subset of the spacer material layers 42, and a third subset of the spacer material layers 42. The first subset of the spacer material layers 42 is formed at source select levels, and is herein referred to as source-select-level spacer material layers 42S, as shown in FIG. 1B. Source select levels refer to levels at which electrodes surrounding vertical semiconductor channels of NAND strings at source-side ends of vertical semiconductor channels are divided to enable activation or deactivation of groups (e.g., blocks) of NAND strings from the source side. The second subset of the spacer material layers 42 is formed at word line levels, and is herein referred to as word-line-level spacer material layers 42W. Word line levels refer to levels at which control gate electrodes functioning as word lines are present. Memory elements are subsequently formed at each level of the word lines. The third subset of the spacer material layers 42 is formed at drain select levels, and is herein referred to as drain-select-level spacer material layers 42D. Drain select levels refer to levels at which electrodes surrounding vertical semiconductor channels of NAND strings at drain-side ends of vertical semiconductor channels are divided to enable activation or deactivation of groups (e.g., blocks) of NAND strings from the drain side. The word-line-level spacer material layers 42W are located between the source-select-level spacer material layers 42S and the drain-select-level spacer material layers 42D.

The insulating layers 32 of the vertical repetition can include, from bottom to top, a first subset of the insulating layers 32, a second subset of the insulating layers 32, and a third subset of the insulating layers 32. The first subset of the insulating layers 32 is more proximal to the sacrificial substrate 8 than a topmost one of the source-select-level spacer material layers 42S, and is herein referred to as source-select-level insulating layers 32S. The third subset of the insulating layers 32 is more distal from the sacrificial substrate 8 than a bottommost one of the drain-select-level spacer material layers 42D, and is herein referred to as drain-select-level insulating layers 32D. The second subset of the insulating layers 32 include all insulating layers 32 other than the first subset of the insulating layers 32 and the third subset of the insulating layers 32, and is herein referred to as word-line-level insulating layers 32W. The word-line-level insulating layers 32W are located between the source-select-level insulating layers 32S source-select-level insulating layers 32S and the drain-select-level insulating layers 32D.

The total number of the source-select-level spacer material layers 42S may be in a range from 1 to 8, such as from 2 to 4. The total number of the drain-select-level spacer material layers 42D may be in a range from 1 to 8, such as from 2 to 4. The total number of the word-line-level spacer material layers 42W may be in a range from 32 to 1,024, such as from 64 to 256, although lesser and greater numbers may also be employed.

According to an aspect of the present disclosure, each layer within the first subset of the spacer material layers 42 and the first subset of the insulating layers 32 may be formed as unpatterned material layers (i.e., blanket material layers) having a respective uniform thickness throughout. Source-select-level line trenches laterally extending along a first horizontal direction (e.g., word line direction) hd1 and laterally spaced apart along a second horizontal direction (e.g., bit line direction) hd2 that is perpendicular to the first horizontal direction hd1 can be formed through the first subset of the spacer material layers 42 and the first subset of the insulating layers 32. The source-select-level line trenches may extend down to a top surface of the sacrificial substrate 8. The width of each source-select-level line trench along the second horizontal direction hd2 may be on the order of a lateral dimension (such as a diameter) of memory openings to be subsequently formed. The lateral dimension of each memory opening to be subsequently formed may be in a range from 40 nm to 500 nm, and/or from 80 nm to 250 nm, although lesser and greater lateral dimensions may also be employed. The spacing between neighboring pair of source-select-level line trenches along the second horizontal direction hd2 may be in a range from 2 times the lateral dimension of each memory opening to be subsequently formed to 16 times the lateral dimension of each memory opening to be subsequently formed.

The source-select-level line trenches can be subsequently filled with a dielectric fill material, such as silicon oxide, to form source-select-level dielectric isolation structures 22. As shown in FIG. 1D, the vertical cross-sectional view of FIG. 1A is taken in a vertical cross-sectional plane that does not cut through a source-select-level dielectric isolation structure 22.

Generally, each spacer material layer 42 within the first subset of the spacer material layers 42 is divided into multiple source-select-level spacer material layers 42S that are laterally spaced apart by the source-select-level dielectric isolation structures 22. The multiple source-select-level spacer material layers 42S have a respective strip shape that laterally extends along the first horizontal direction hd1 and may have a uniform width along the second horizontal direction hd2, and are herein referred to as source-select-level spacer material strips 42S. Each source-select-level spacer material strip 42S may be a source-select-level electrically conductive strip, or may be a source-select-level sacrificial material strip that is subsequently replaced with a source-select-level electrically conductive strip.

Likewise, each insulating layer 32 within the first subset of the insulating layers 32 is divided into multiple source-select-level insulating layers 32S that are laterally spaced apart by the source-select-level dielectric isolation structures 22. The multiple source-select-level insulating layers 32S have a respective strip shape that laterally extends along the first horizontal direction hd1 and may have a uniform width along the second horizontal direction hd2, and are herein referred to as source-select-level insulating strips 32S.

The source-select-level insulating strips 32S laterally extend along the first horizontal direction, are laterally spaced apart along the second horizontal direction by the source-select-level dielectric isolation structures 22, and are vertically offset from the source-select-level spacer material strips 42S.

Subsequently, the word-line-level insulating layers 32W and the word-line-level spacer material layers 42W can be deposited. After deposition of the third subset of the spacer material layers 42 (i.e., 42D) and the third subset of the insulating layers 32 (i.e., 32D), drain-select-level line trenches laterally extending along the first horizontal direction hd1 and laterally spaced apart along the second horizontal direction hd2 can be formed through the third subset of the spacer material layers 42 and the third subset of the insulating layers 32. The drain-select-level line trenches may extend through each layer among the third subset of the spacer material layers 42 and the third subset of the insulating layers 32. The width of each drain-select-level line trench along the second horizontal direction hd2 may be on the order of the lateral dimension (such as a diameter) of memory openings to be subsequently formed. The spacing between neighboring pair of drain-select-level line trenches along the second horizontal direction hd2 may be in a range from 2 times the lateral dimension of each memory opening to be subsequently formed to 16 times the lateral dimension of each memory opening to be subsequently formed. In one embodiment, the areas of the drain-select-level line trenches may vertically overlap with the areas of the source-select-level dielectric isolation structures 22.

The drain-select-level line trenches can be subsequently filled with a dielectric fill material, such as silicon oxide, to form drain-select-level dielectric isolation structures 72. As shown in FIG. 1C, the vertical cross-sectional view of FIG. 1A is taken in a vertical cross-sectional plane that does not cut through a drain-select-level dielectric isolation structure 72.

Generally, each spacer material layer 42 within the third subset of the spacer material layers 42 is divided into multiple drain-select-level spacer material layers 42D that are laterally spaced apart by the drain-select-level dielectric isolation structures 72. The multiple drain-select-level spacer material layers 42D have a respective strip shape that laterally extends along the first horizontal direction hd1 and may have a uniform width along the second horizontal direction hd2, and are herein referred to as drain-select-level spacer material strips 42D. Each drain-select-level spacer material strip 42D may be a drain-select-level electrically conductive strip, or may be a drain-select-level sacrificial material strip that is subsequently replaced with a drain-select-level electrically conductive strip.

Likewise, each insulating layer 32 within the third subset of the insulating layers 32 is divided into multiple drain-select-level insulating layers 32D that are laterally spaced apart by the drain-select-level dielectric isolation structures 72. The multiple drain-select-level insulating layers 32D have a respective strip shape that laterally extends along the first horizontal direction hd1 and may have a uniform width along the second horizontal direction hd2, and are herein referred to as drain-select-level insulating strips 32D.

The drain-select-level insulating strips 32D laterally extend along the first horizontal direction, are laterally spaced apart along the second horizontal direction by the drain-select-level dielectric isolation structures 72, and are vertically offset from the drain-select-level spacer material strips 42D.

Subsequently, an insulating cap layer 70 can be deposited over the vertical repetition (32, 42). The insulating cap layer 70 may have the same material composition as the insulating layers 32, and may have a same thickness as the insulating layers 32.

Figure 2A:
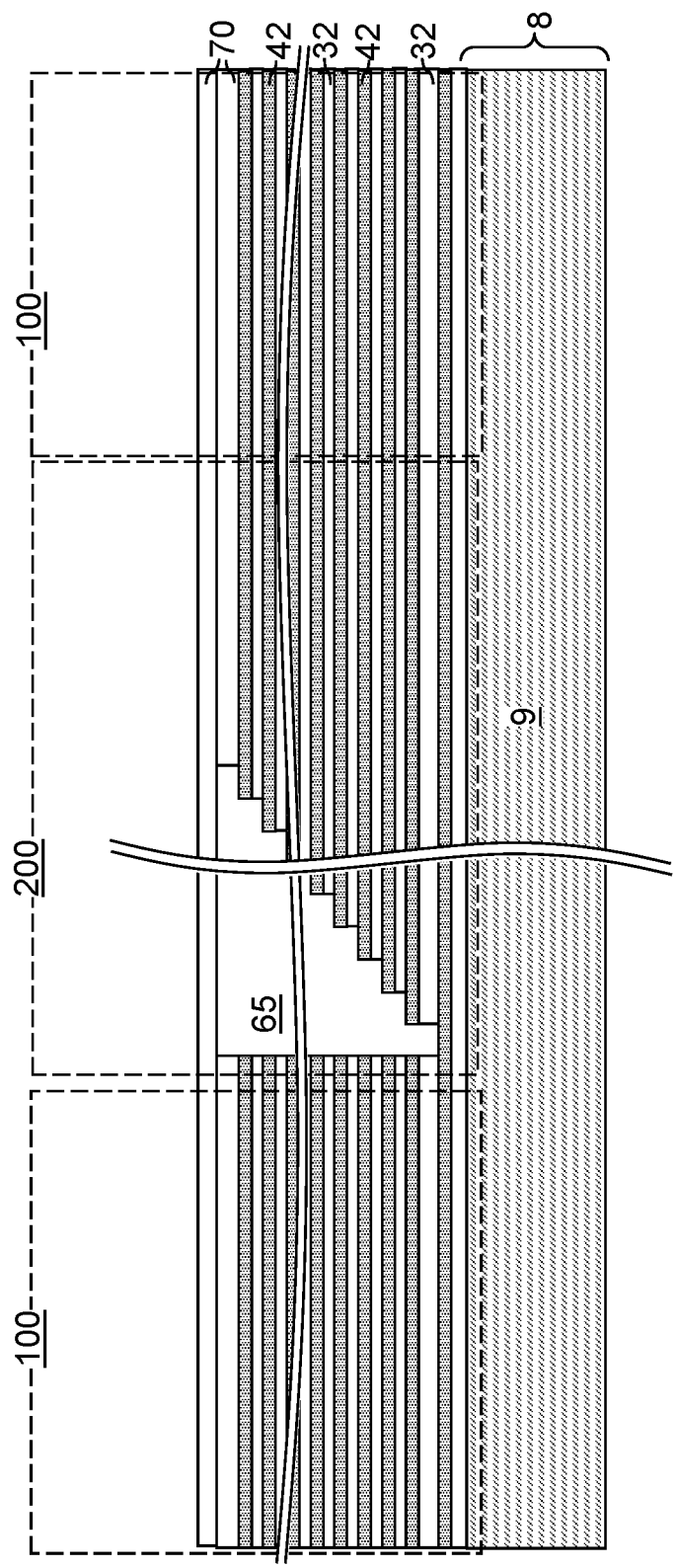
FIG. 2A is a vertical cross-sectional view of the first exemplary structure after patterning of stepped surfaces, a retro-stepped dielectric material portion, and an insulating cap lay according to the first embodiment of the present disclosure.
Figure 2B:
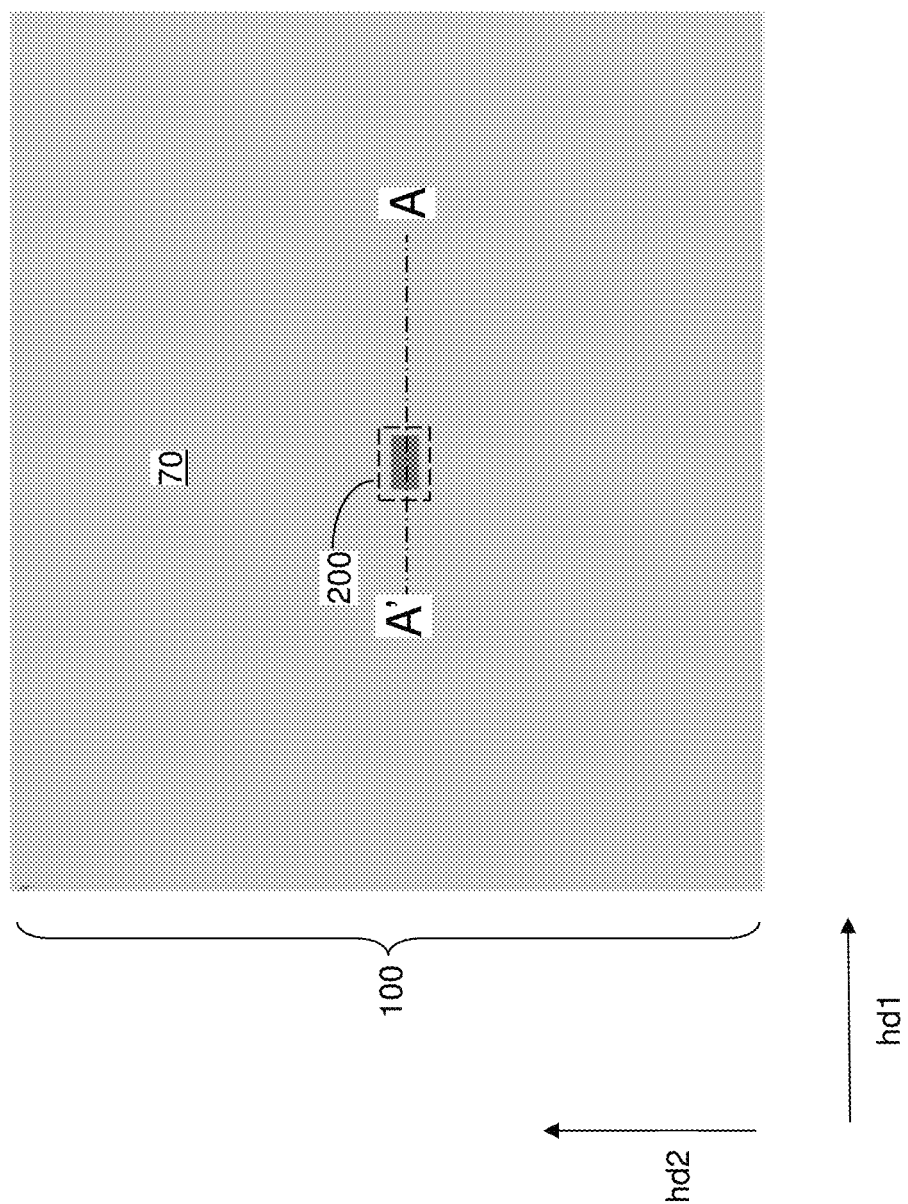
FIG. 2B is a see-through top-down view of a first configuration of the first exemplary structure of FIG. 2A. The vertical plane A-A' corresponds to the plane of the vertical cross-sectional view of FIG. 2A.
Figure 2C:
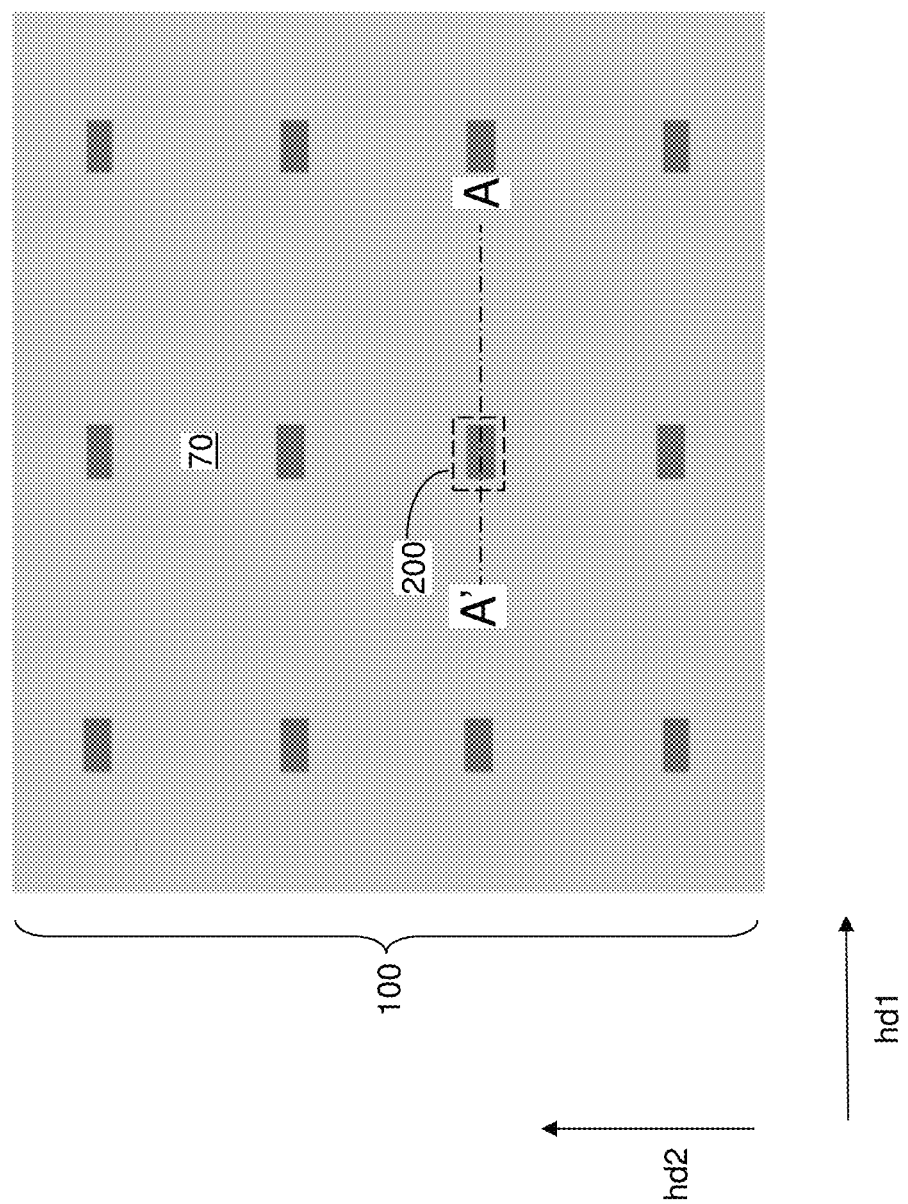
FIG. 2C is a see-through top-down view of a second configuration of the first exemplary structure of FIG. 2A. The vertical plane A-A' corresponds to the plane of the vertical cross-sectional view of FIG. 2A.
Figure 3A:
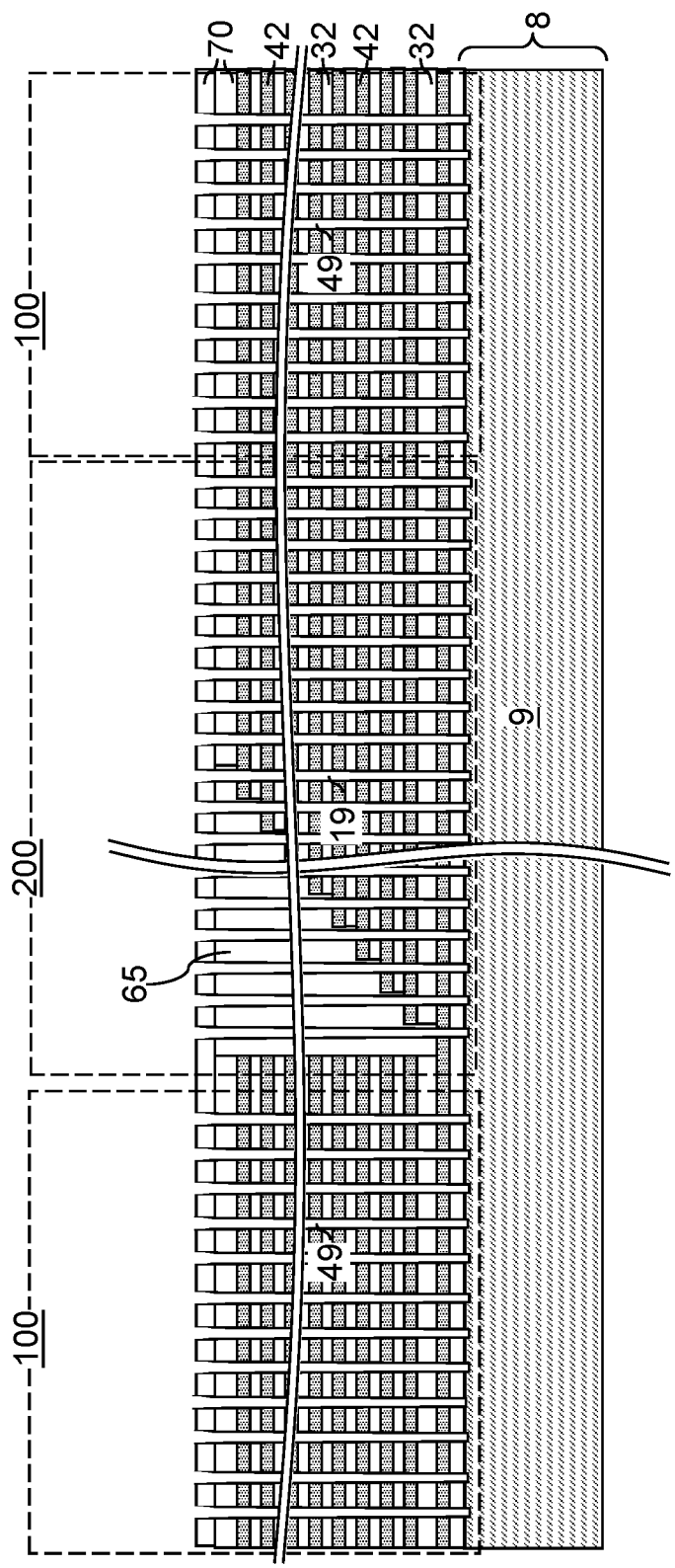
FIG. 3A is a vertical cross-sectional view of the first exemplary structure after formation of memory openings and support openings according to the first embodiment of the present disclosure.
Figure 3B:
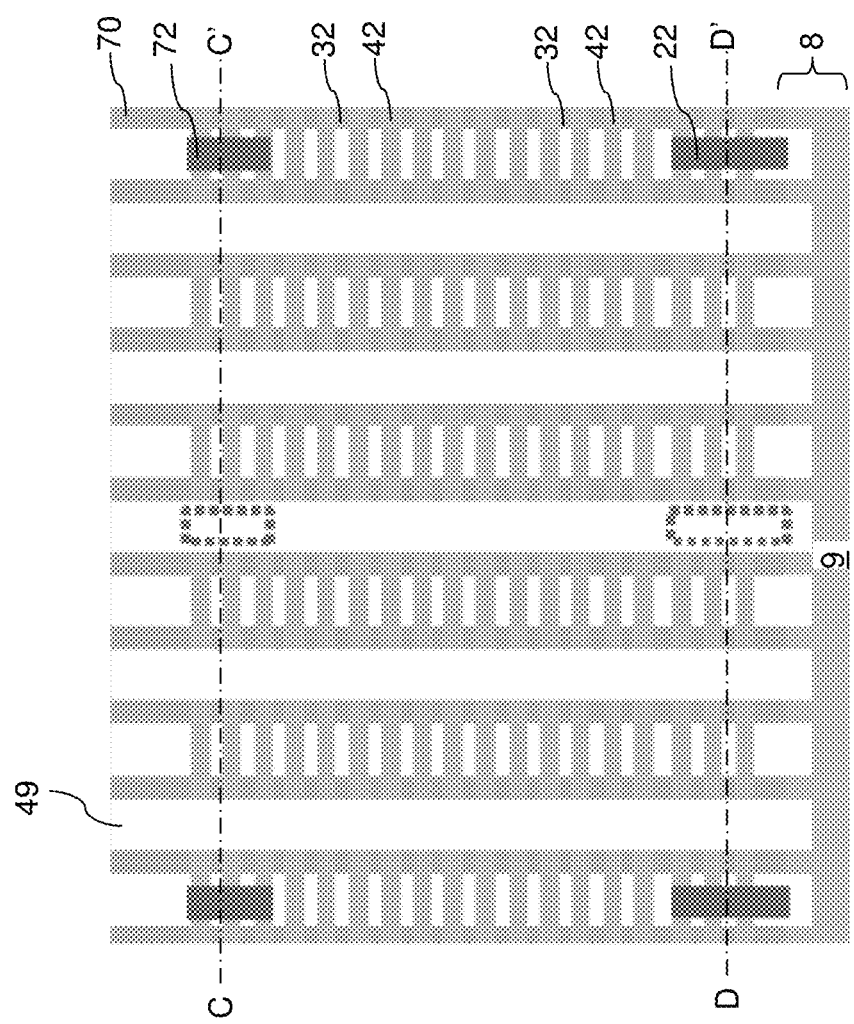
FIG. 3B is a horizontal cross-sectional view of a memory array region of the first exemplary structure along the horizontal plane B-B' in FIGS. 3C and 3D.

Referring to FIGS. 2A, 2B, and 2C, the insulating cap layer 70 and the vertical repetition (32, 42) can be patterned to form at least one area of stepped surfaces. Each region in which stepped surfaces are formed is herein referred as a contact region 200, in which layer contact via structures contacting electrically conductive layers (which may be the spacer material layers 42 or may be derived from the spacer material layers 42 by replacing or metallizing sacrificial spacer material layers 42) are subsequently formed. The complement of the at least one area of stepped surfaces is herein referred to as a memory array region 100, in which a memory array is subsequently formed. FIG. 2B illustrates a first configuration in which a single area of stepped surfaces (i.e., a single contact region 200) is formed. FIG. 2C illustrates a second configuration in which multiple areas of stepped surfaces are formed. The first configuration provides the advantage of utilizing a smaller device area for the contact region 200, thereby maximizing the area for the memory array region 100. The second configuration provides the advantage of reducing resistance of the electrically conductive layers by providing multiple layer contact via structures that are electrically connected in parallel to each electrically conductive layer.

Each contiguous set of stepped surfaces can be formed, for example, by forming a mask layer with an opening therein, etching a cavity through the insulating cap layer 70, and iteratively expanding the etched area and vertically recessing the cavity by etching each pair of an insulating layer 32 and a spacer material layer 42 located directly underneath the bottom surface of the etched cavity within the etched area. Upon completion of formation of the stepped surfaces, each contiguous set of stepped surfaces may continuously extend from a bottommost layer within the vertically repetition (32, 42) to a topmost layer within the vertical repetition (32, 42).

A dielectric material, such as a silicate glass, can be deposited in the stepped cavities. The dielectric material is subsequently planarized to provide a planar surface within a horizontal plane including a top surface of the insulating cap layer 70. Each continuous remaining portion of the dielectric material overlying a contiguous set of stepped surfaces and filling an overlying stepped cavity constitutes a retro-stepped dielectric material portion 65. In one embodiment, each retro-stepped dielectric material portion 65 may comprise, and/or may consist of, a silicate glass material. As used herein, a "retro-stepped" element refers to an element that has stepped surfaces and a horizontal cross-sectional area that increases monotonically as a function of a vertical distance from a top surface of a substrate on which the element is present.

Referring to FIGS. 3A-3D, openings can be formed through the vertical repetition (32, 42). For example, a photoresist layer (not shown) can be applied over the insulating cap layer 70, and can be lithographically patterned to form openings therein. The pattern of the openings in the photoresist layer can be transferred through the vertical repetition (32, 42) by performing an anisotropic etch process. Openings having vertical or tapered sidewalls and extending at least down to a top surface of the sacrificial substrate 8 can be formed through the vertical repetition (32, 42).

The openings through the vertical repetition (32, 42) can include memory openings 49 that are formed within an outer periphery of the memory array region 100, and boundary openings (not shown) that are formed at the outer periphery of the memory array region 100. Further, the openings through the vertical repetition (32, 42) may optionally include support openings that are interlaced with the memory openings 49 in the memory array region 100 and/or the contact region 200, and are subsequently employed to form support pillar structures.

In one embodiment, the memory openings 49 may be formed in rows that laterally extend along the first horizontal direction hd1. Each set of memory openings 49 within a respective row of memory openings 49 may be arranged in a straight line extending along the first horizontal direction hd1. Rows of memory openings 49 may be laterally spaced apart along the second horizontal direction hd2. At least one row of memory openings 49 can be formed between each neighboring pair of drain-select-level dielectric isolation structures 72 and between each neighboring pair of source-select-level dielectric isolation structures 22. The total number of rows of memory openings 49 between each neighboring pair of drain-select-level dielectric isolation structures 72 may be in a range from 1 to 24, such as from 2 to 12, and/or from 4 to 8, although a greater number may also be employed. In one embodiment, each drain-select-level dielectric isolation structure 72 may be perforated by a respective row of memory openings 49. Further, each source-select-level dielectric isolation structure 22 may be perforated by a respective row of memory openings 49. In such case, the memory openings 49 that extend through a drain-select-level dielectric isolation structure 72 or a source-select-level dielectric isolation structure 22 may be dummy memory openings in which a dummy memory opening fill structure is subsequently formed. As used herein, a dummy structure refers to a structure that is not electrically active, i.e., does not include any electrically active node of an electrical device (e.g., is not electrically connected to a bit line to be formed in a later step).

FIGS. 4A-4G are sequential vertical cross-sectional views of a periphery of a memory array region of the first exemplary structure during formation of a perforated dielectric wall structure.

Referring to FIG. 4A, a row of boundary openings 19 can be formed at the periphery of each memory array region 100 (e.g., at a periphery of a memory plane) that borders another memory array region 100 (e.g., another memory plane) at the processing steps of FIGS. 3A-3D. In other words, the row of boundary openings 19 can be formed along the boundary between two memory array regions 100. Generally, the boundary openings 19 can be arranged such that a set of boundary openings 19 encircles a memory array region 100 (e.g., a memory plane containing plural memory blocks). Within each set of boundary openings 19 that encircle a memory array region, each neighboring pair of the boundary openings 19 can be laterally spaced apart from each other by a lesser lateral distance than the minimum of the lateral distances between each boundary opening 19 and a respective most proximal one of the memory openings 49.

Referring to FIG. 4B, a dielectric conversion process can be performed to physically convert exposed surface portions of the spacer material layers 42 into dielectric spacers 17. If the spacer material layers 42 includes an oxidizable semiconductor material such as silicon or an oxidizable metallic material that forms a dielectric oxide material, an oxidation process may be performed to form the dielectric spacers 17 through conversion of the surface portions of the spacer material layers 42 that are exposed in the boundary openings 19 and the memory openings 49 into dielectric oxide material portions. For example, if the spacer material layers 42 include amorphous silicon or polysilicon, then an oxidation process may be performed to form silicon oxide dielectric spacers 17. If the spacer material layers 42 include a metallic material, an oxidation process may be performed to covert the surface portions of the spacer material layers into dielectric metal oxide spacers. Alternatively, if the spacer material layers 42 includes a semiconductor material that can be converted into a dielectric nitride material, a nitridation process be performed to form the dielectric spacers 17 through conversion of the exposed surface portions of the spacer material layers 42 into dielectric nitride material portions. For example, if the spacer material layers 42 include amorphous silicon or polysilicon, then a nitridation process may be performed to form silicon nitride dielectric spacers 17. A vertical stack of annular dielectric spacers 17 can be formed within each of the memory openings 49 and the boundary openings 19.

Figure 4D:
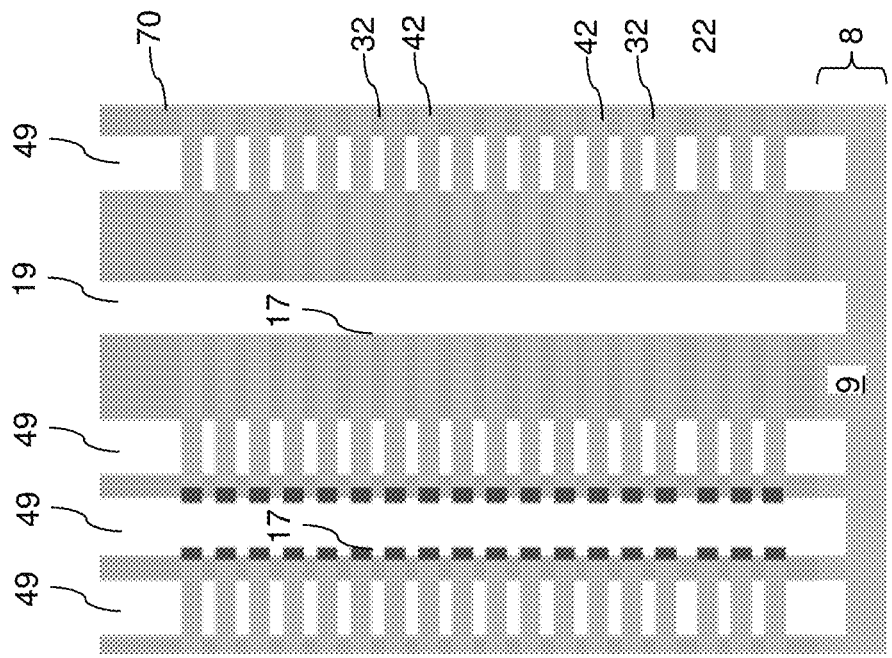
Figure 4C:
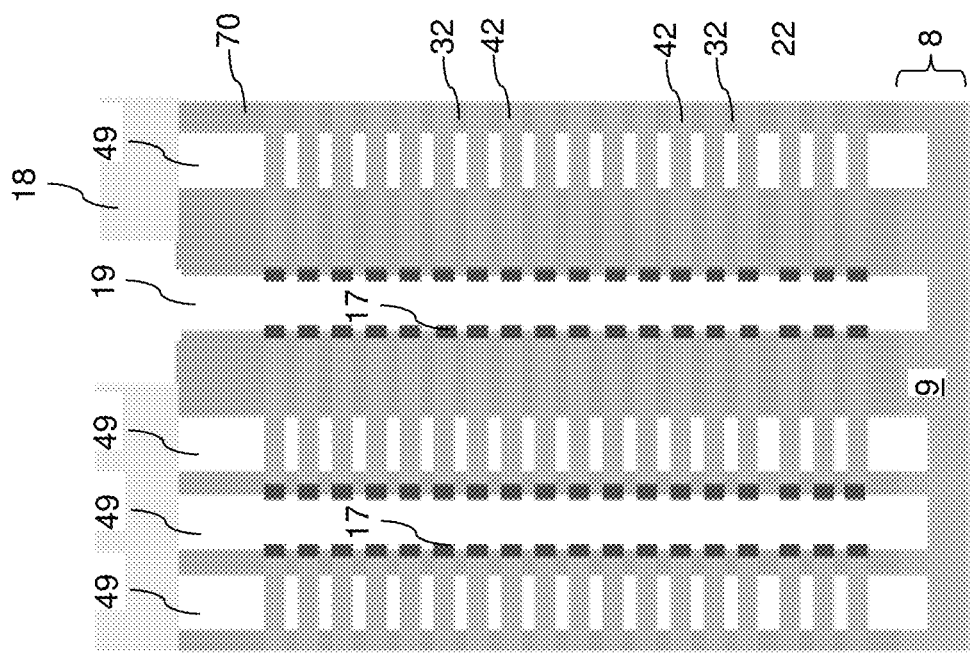

Referring to FIG. 4C, a masking material layer 18 (such as a patterned photoresist layer) can be formed over the memory openings 49 to cover the areas of the memory openings 49 without covering the areas of the boundary openings 19.

Referring to FIG. 4D, an etch process, such as an isotropic etch process, can be performed to remove the dielectric spacers 17 from inside of each boundary opening 19. For example, if the dielectric spacers 17 include silicon oxide, a hydrofluoric acid wet etch process can be performed to remove the dielectric spacers 17. Generally, the etch chemistry can be selected such that collateral etching of the insulating layers 32 is minimized during removal of the dielectric spacers 17. The masking material layer 18 may be subsequently removed, for example, by aching. Alternatively, the masking material layer 18 may be removed at a subsequent processing step after formation of perforated trenches.

Figure 4F:
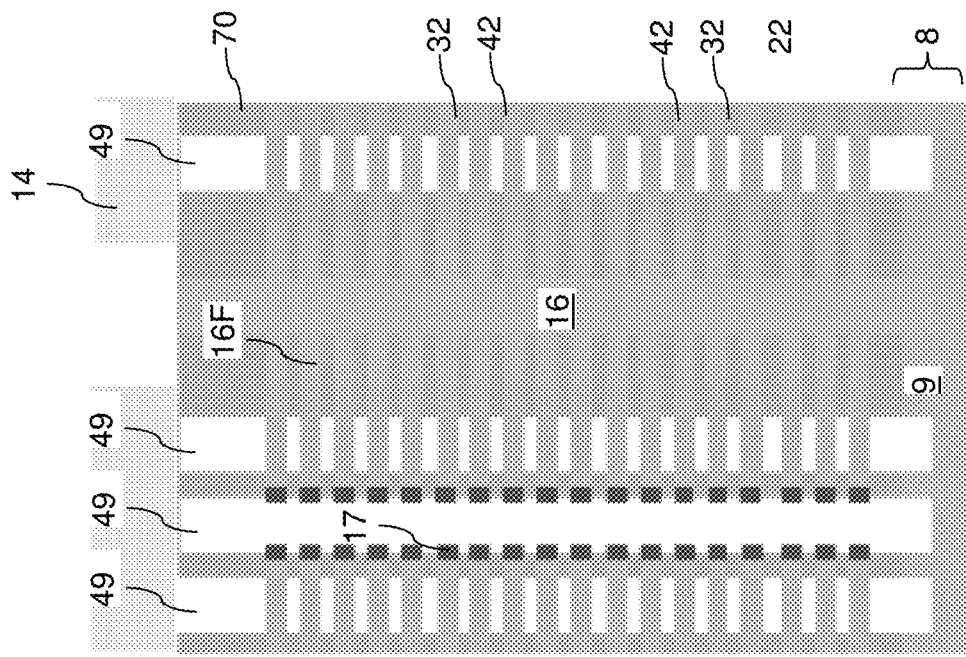
Figure 4E:
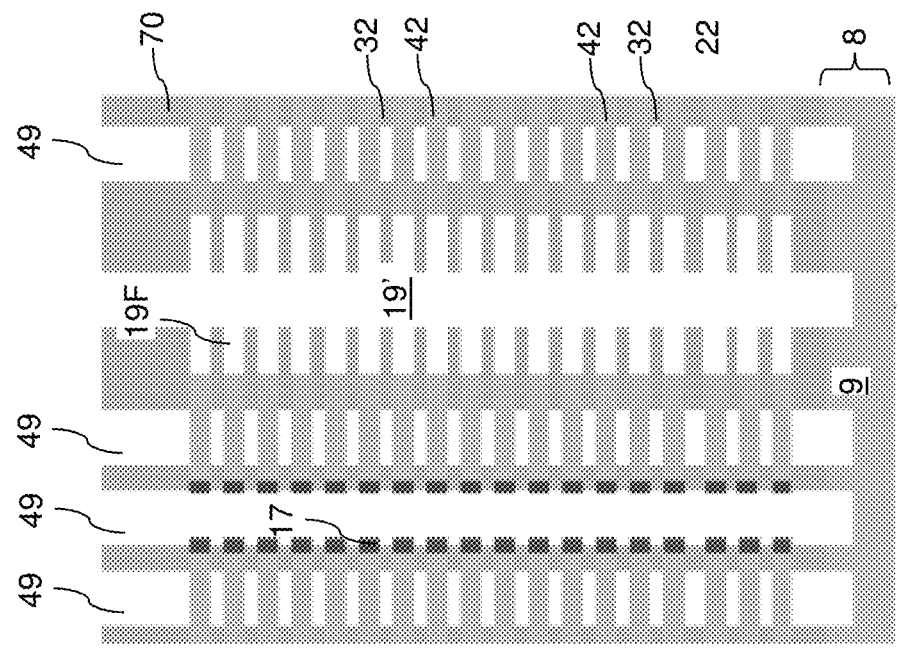

Referring to FIG. 4E, an isotropic etch process may be performed to laterally recess physically exposed surfaces of the spacer material layers 42 selective to the material of the insulating layers 32. In one embodiment, a wet etch process may be employed to laterally recess the physically exposed surfaces of the spacer material layers 42. In an illustrative example, if the spacer material layers 42 include a semiconductor material such as silicon, then a wet etch process employing hot trimethyl-2 hydroxyethyl ammonium hydroxide ("hot TMY") or tetramethyl ammonium hydroxide (TMAH) may be performed to laterally recess the spacer material layers 42 selective to the insulating layers 32.

According to an aspect of the present disclosure, the duration of the isotropic etch process that laterally recesses the spacer material layers 42 can be selected such that laterally-expanded fin portions 19F of each boundary opening 19 merges with the laterally-expanded fin portions of a respective neighboring boundary opening 19. Thus, a single contiguous cavity that laterally surrounds a memory array region 100 at the levels of the spacer material layers 42 can be formed by merging of boundary openings 19 within a set of boundary openings 19 that laterally surrounds the memory array region 100.

The single contiguous cavity is contiguously connected at each level of the spacer material layers 42 to provide a continuous annular cavity at each level of the spacer material layers 42. The single contiguous cavity is not continuously connected within each horizontal cross-sectional view at levels of the insulating layers 32, but includes an array of discrete openings that are not adjoined among one another within such horizontal cross-sectional views taken at the levels of the insulating layers 32. In each horizontal cross-sectional view that cuts through an insulating layer, the insulating layer 32 is perforated with the boundary openings at the periphery of the memory array region 100. Thus, the single contiguous cavity is contiguously connected at each level of the spacer material layers 42 is herein referred to as a perforated trench 19'.

Generally, a perforated trench 19' can be formed by laterally recessing sidewalls of the spacer material layers 42 around the boundary openings 19 selective to the insulating layers 32. Each row of boundary openings 19 can merges at levels of the sacrificial material layers 42 to form the perforated trench 19'.

The perforated trench 19' can include a laterally-extending cavity laterally extending along the first horizontal direction hd1 and laterally bounded by a pair of laterally-undulating sidewalls having vertically straight and laterally convex sidewall segments of the spacer material layers 42. The vertically straight and laterally convex sidewall segments of the spacer material layers 42 are adjoined to each other at each level of the spacer material layers 42. The perforated trench includes a row of cylindrical cavity segments at each level of the insulating layers 32, which are volumes of the boundary openings 19 as formed at the processing steps of FIGS. 3A-3D.

Referring to FIG. 4F, a patterning film 14 can be deposited over the insulating cap layer 70, and can be lithographically patterned to form a continuous opening overlying the perforated trench 19'. The patterning film 14 may include a carbon-based material, which includes amorphous carbon or diamond-like carbon as a predominant component. For example, Advanced Patterning Film (APF)™ by Applied Materials, Inc.™ may be employed for the patterning film 14.

A dielectric fill material, such as silicate glass (e.g., silicon oxide) may be deposited in the perforated trench 19' by a conformal deposition process, such as a chemical vapor deposition process. Excess portions of the dielectric fill material can be removed from above the patterning film 14 by a planarization process, which may include a recess etch process and/or a chemical mechanical polishing (CMP) process. Remaining portions of the dielectric fill material comprise at least one perforated dielectric wall structure 16. In one embodiment, a pair of perforated dielectric wall structures 16 laterally extending along the first horizontal direction hd1 and spaced apart along the second horizontal direction hd1 may be formed. Each of the perforated dielectric wall structures 16 comprises a row of openings at each level of the insulating layers 32 and extends continuously along the first horizontal direction hd1 at each level of the spacer material layers 42, which may be electrically conductive layers or may be subsequently replaced with, or may be converted into, electrically conductive layers. Each fin portion 16F of the perforated dielectric wall structures 16 located at a respective level of the spacer material layers 42 comprises a pair of laterally undulating sidewalls having a respective set of vertically straight and laterally convex sidewall segments that are adjoined among one another.

Figures 4G, 4H:
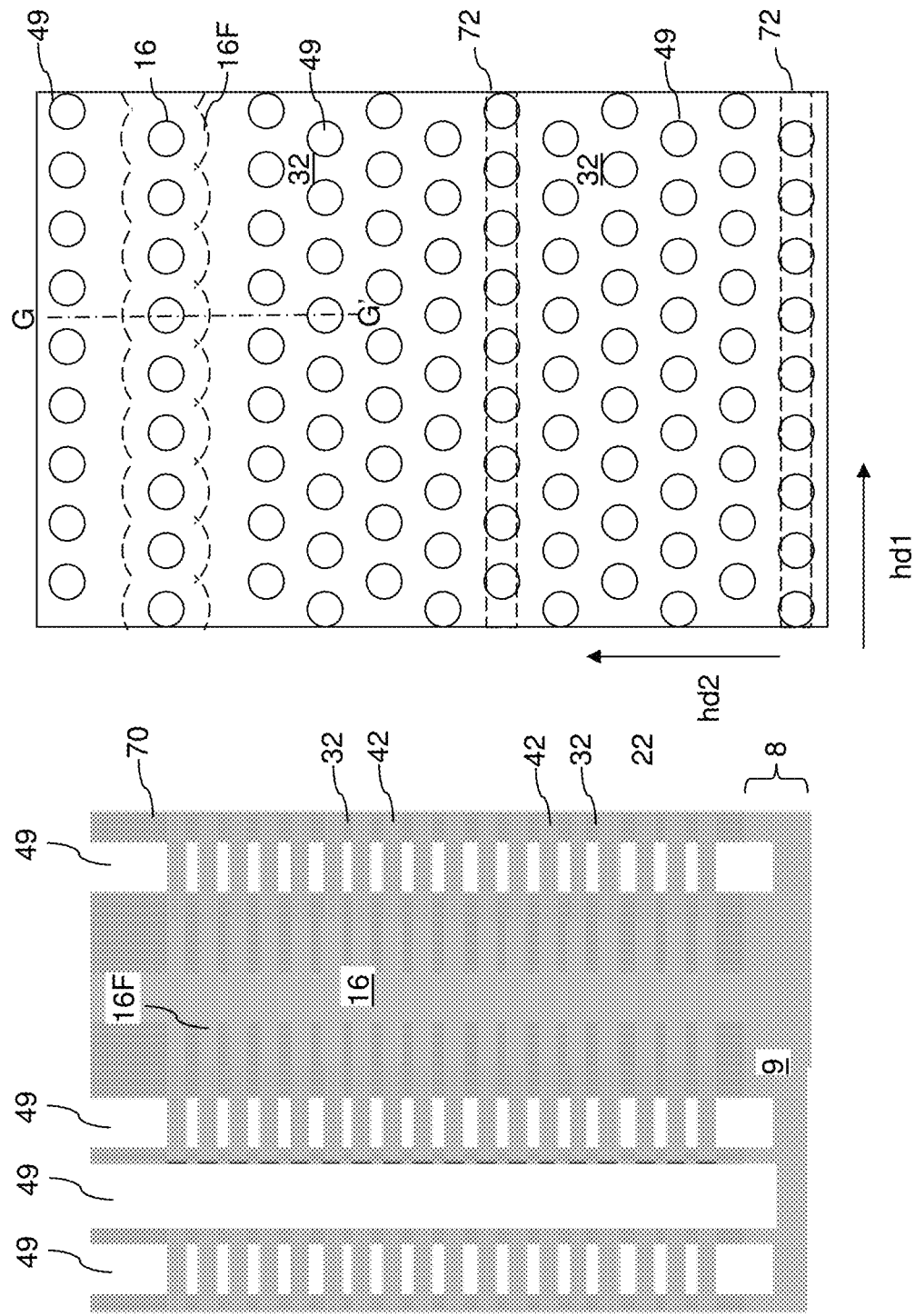

Referring to FIG. 4G, the patterning film 14 can be removed, for example, by ashing. FIG. 4H is a see-through top-down view of the region of the first exemplary structure illustrated in FIG. 4G. An isotropic etch process may be performed to remove the dielectric spacers 17 from around the memory openings 49.

Figure 5:
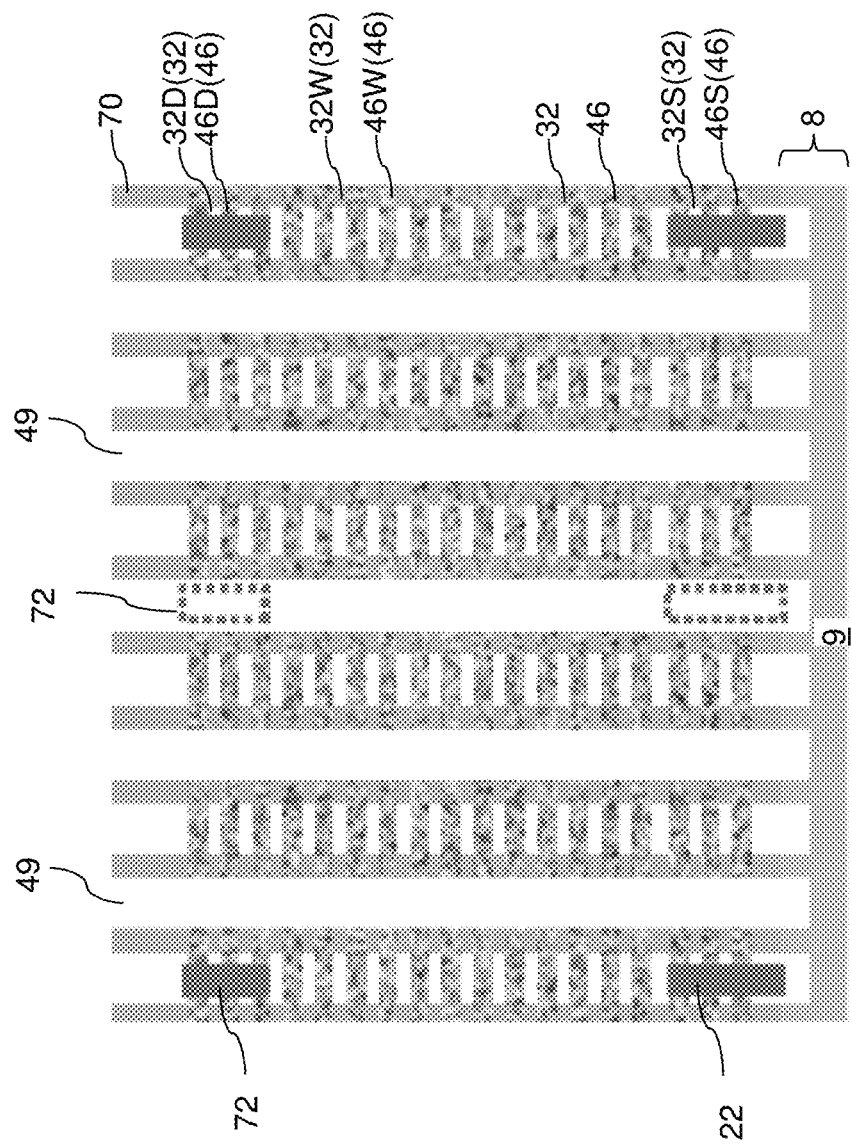
FIG. 5 is a vertical cross-sectional view of a memory array region of the first exemplary structure after formation of electrically conductive layers according to the first embodiment of the present disclosure.

Referring to FIG. 5, in case the spacer material layers 42 are formed as sacrificial material layers, the spacer material layers 42 can be converted into, or can be replaced with, electrically conductive layers 46. In one embodiment, the spacer material layers 42 comprise a semiconductor material, and the semiconductor material of the spacer material layers 42 can be converted into a metal-semiconductor alloy by a metallization process. For example, the spacer material layers 42 may include silicon, and a metal that forms a metal silicide can be deposited on the sidewalls of the memory openings 49. Metals that form a metal silicide include, but are not limited to, tungsten, titanium, cobalt, nickel, molybdenum or platinum. Generally, a metallic element that forms a metal-semiconductor alloy upon reaction with the semiconductor material of the spacer material layers 42 can be deposited on the sidewalls of the memory openings 49, and an anneal process can be performed to induce metallization of the semiconductor material of the spacer material layers 42. The spacer material layers 42 can be converted into electrically conductive layers 46 including a metal semiconductor alloy (e.g., a metal silicide, such as tungsten, titanium, cobalt, nickel, molybdenum or platinum silicide). Generally, at least one metallic element can be introduced into the spacer material layers 42 through the memory openings 49, and formation of the metal-semiconductor alloy can be induced by performing a thermal anneal process.

In an alternative embodiment in which the spacer material layers 42 are formed as sacrificial material layers, the spacer material layers 42 can be removed selective to the materials of the insulating layers 32 by an isotropic etch process through the memory openings to form horizontal recesses. For example, if the spacer material layers 42 include silicon or a silicon-germanium alloy, a wet etch process employing TMAH or TMY may be performed. Alternatively, if the spacer material layers 42 include silicon nitride, a wet etch process employing hot phosphoric acid may be performed. At least one conductive material such as a combination of a metallic nitride liner material and a metallic fill material including an elemental metal or an intermetallic alloy can be deposited in the recesses through the memory openings 49 employing at least one conformal deposition process. Excess portions of the at least one conductive material can be removed from inside the memory openings 49 and from above the insulating cap layer 70 employing at least one etch process, which may include anisotropic etch process and/or an isotropic etch process. Each remaining portion of the at least one conductive material that fills a respective recess constitutes an electrically conductive layer 46.

In case the spacer material layers 42 are formed as electrically conductive layers 46, the processing steps of FIG. 5 can be omitted.

The electrically conductive layers 46 include a first subset of the electrically conductive layers 46 located at source select levels, a second subset of the electrically conductive layers 46 located at word line levels, and a third subset of the electrically conductive layers 46 located at drain select levels. The first subset of the electrically conductive layers 46 comprises source-select-level electrically conductive strips 46S laterally extending along the first horizontal direction hd1 and laterally spaced apart along the second horizontal direction hd2 by source-select-level dielectric isolation structures 22.

The source-select-level insulating strips 32S can laterally extend along the first horizontal direction hd1, can be laterally spaced apart along the second horizontal direction hd2 by the source-select-level dielectric isolation structures 22, and can be vertically offset from the source-select-level electrically conductive strips 46S. A first subset of the source-select-level insulating strips 32S can be located between the sacrificial substrate 8 and the source-select-level electrically conductive strips 46S. Each source-select-level insulating strip of the first subset of the source-select-level insulating strips 32S can contact the sacrificial substrate 8.

The second subset of the electrically conductive layers 46 includes word-line-level electrically conductive layers 46W. An alternating stack of word-line-level electrically conductive layers 46W and word-line-level insulating layers 32W can be located on a first side of the source-select-level electrically conductive strips 46S, and can continuously extending over, or under (if viewed upside down), each of the source-select-level electrically conductive strips 46S and the source-select-level dielectric isolation structures 22.

The third subset of the electrically conductive layers 46 comprises drain-select-level electrically conductive strips 46D laterally extending along the first horizontal direction hd1 and laterally spaced apart along the second horizontal direction hd2 by drain-select-level dielectric isolation structures 72. The drain-select-level insulating strips 32D can laterally extend along the first horizontal direction hd1, can be laterally spaced apart along the second horizontal direction hd2 by the drain-select-level dielectric isolation structures 72, and can be vertically offset from the drain-select-level electrically conductive strips 46D. The alternating stack of word-line-level electrically conductive layers 46W and word-line-level insulating layers 32W is located between the stack of the source-select-level insulating strips 32S and the source-select-level electrically conductive strips 46S and the stack of the drain-select-level insulating strips 32D and the drain-select-level electrically conductive strips 46D.

Figure 6A:
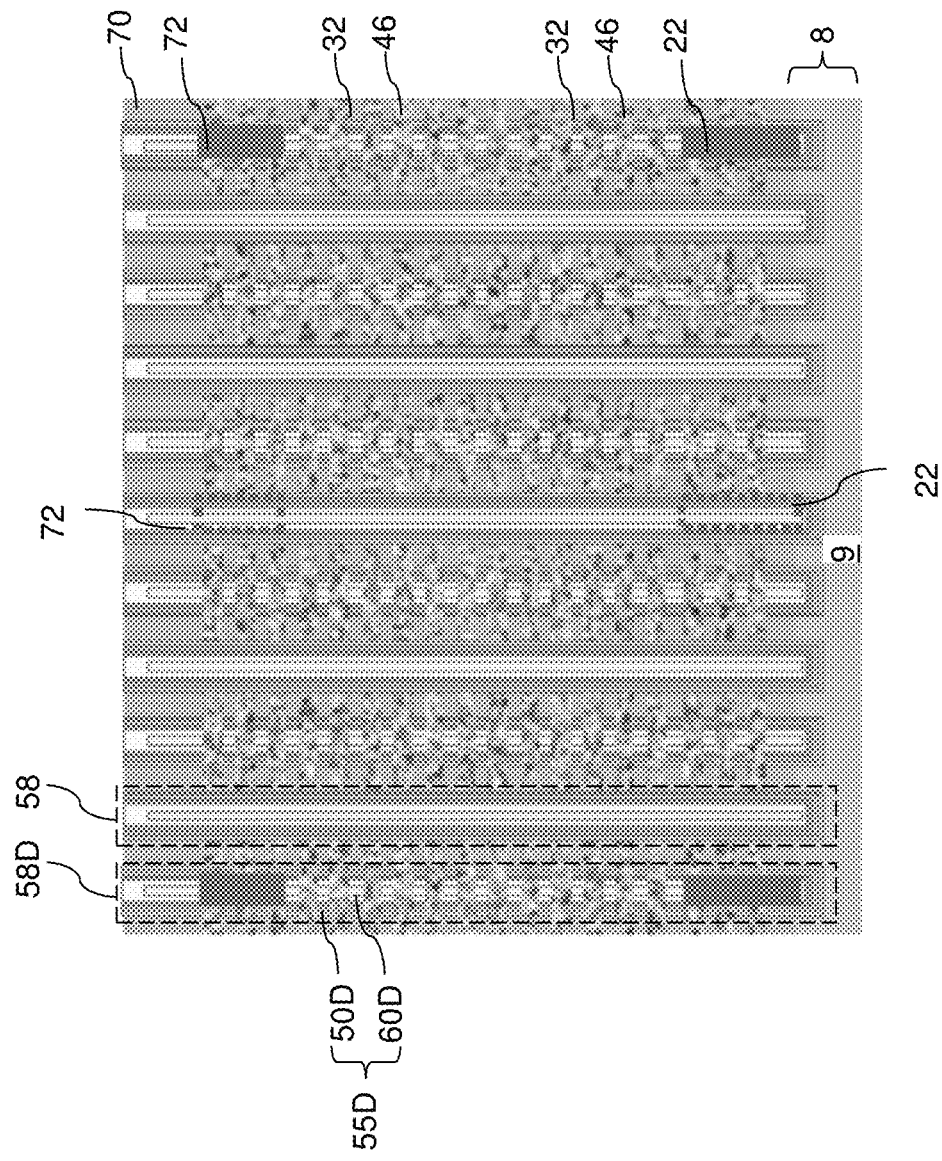
FIG. 6A is a vertical cross-sectional view of a memory array region of the first exemplary structure after formation of memory opening fill structures according to the first embodiment of the present disclosure.
Figure 6B:
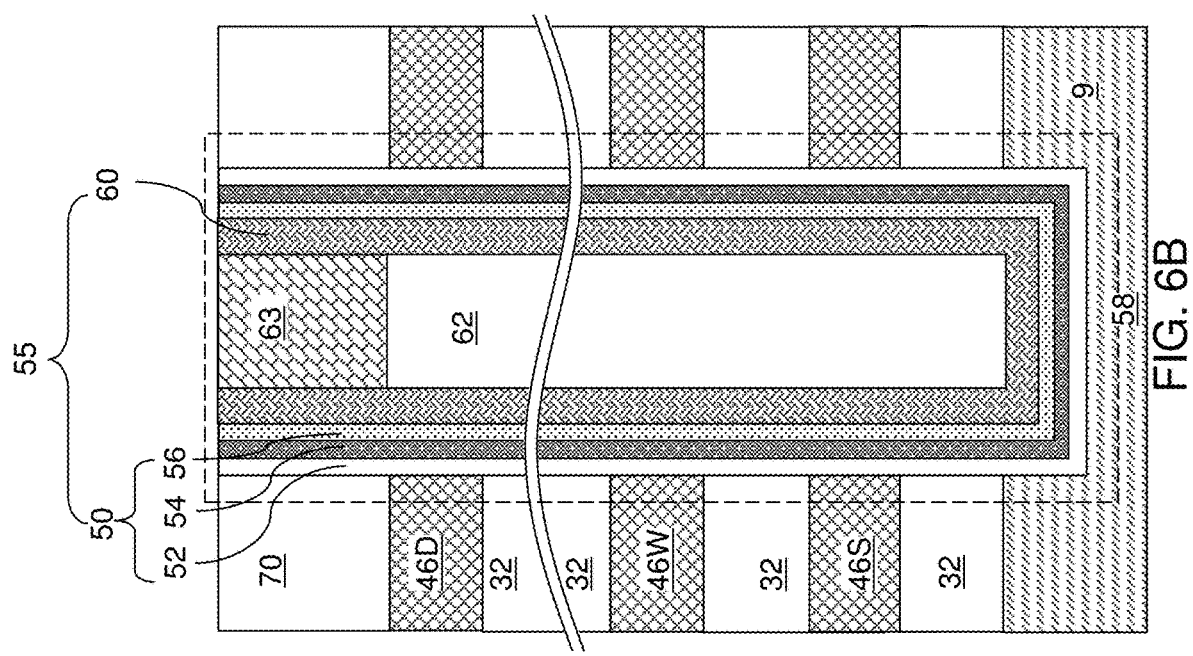
FIG. 6B is a magnified view of a region including a memory opening fill structure within the first exemplary structure of FIG. 6A.

Referring to FIGS. 6A and 6B, a memory opening fill structure 58 can be formed within each memory opening 49. For example, a blocking dielectric layer 52, a charge storage layer 54, a tunneling dielectric layer 56, and a vertical semiconductor channel material layer including an intrinsic or doped semiconductor material having a doping of a first conductivity type can be sequentially deposited employing a respective deposition process. A dielectric fill material such as silicon oxide can be deposited in unfilled volumes of the memory openings 49, and can be vertically recessed to form a dielectric core 62 within each memory opening 49. A doped semiconductor material having a doping of a second conductivity type can be deposited in recess cavities overlying the dielectric cores 62. The second conductivity type is the opposite of the first conductivity type. Excess portions of the blocking dielectric layer 52, the charge storage layer 54, the tunneling dielectric layer 56, the vertical semiconductor channel material layer, and the doped semiconductor material having a doping of the second conductivity type can be removed from above the horizontal plane including the top surface of the insulating cap layer 70 by a planarization process, which may include a recess etch process and/or a chemical mechanical polishing process. Each remaining portion of the doped semiconductor material having a doping of the second conductivity constitutes a drain region 63. Each remaining portion of the vertical semiconductor channel material layer constitutes a vertical semiconductor channel 60. Each contiguous combination of remaining portions of the blocking dielectric layer 52, the charge storage layer 54, and the tunneling dielectric layer 56 constitutes a memory film 50. Each contiguous combination of a memory film 50 and a vertical semiconductor channel 60 constitutes a memory stack structure 55. Each memory opening fill structure 58 can include a memory stack structure 55, a dielectric core 62, and a drain region 63.

Generally, memory opening fill structures 58 can be formed in the memory openings 49. Each of the memory opening fill structures 58 comprises a memory film 50 and a vertical semiconductor channel 60. The memory stack structures 58 vertically extend through an alternating stack of word-line-level electrically conductive layers 46W and word-line-level insulating layers 32W and respective subsets of the source-select-level electrically conductive strips 46S and the drain-select-level electrically conductive strips 46D. Each of the memory stack structures 58 comprises a respective memory film 50, a respective drain region 63, and a respective vertical semiconductor channel 60 having a source-side end contacting the sacrificial substrate 8.

Dummy memory stack structures 55D which are part of dummy memory opening fill structures 58D can be formed within a subset of the memory openings 49 that pass through a respective one of the source-select-level dielectric isolation structures 22 and a respective one of the drain-select-level dielectric isolation structures 72. Each of the dummy memory stack structures 55D comprises a dummy memory film 50D having a same material composition as the memory films and a dummy vertical semiconductor channel 60D having a same material composition as the vertical semiconductor channels 60. Each of the dummy memory stack 55D structures is an electrically inactive structure, and as such, is electrically isolated from memory-side metal interconnect structures (e.g., from the bit lines) to be subsequently formed and electrically isolated from source strips (e.g., source line strips) to be subsequently formed.

Figure 7:
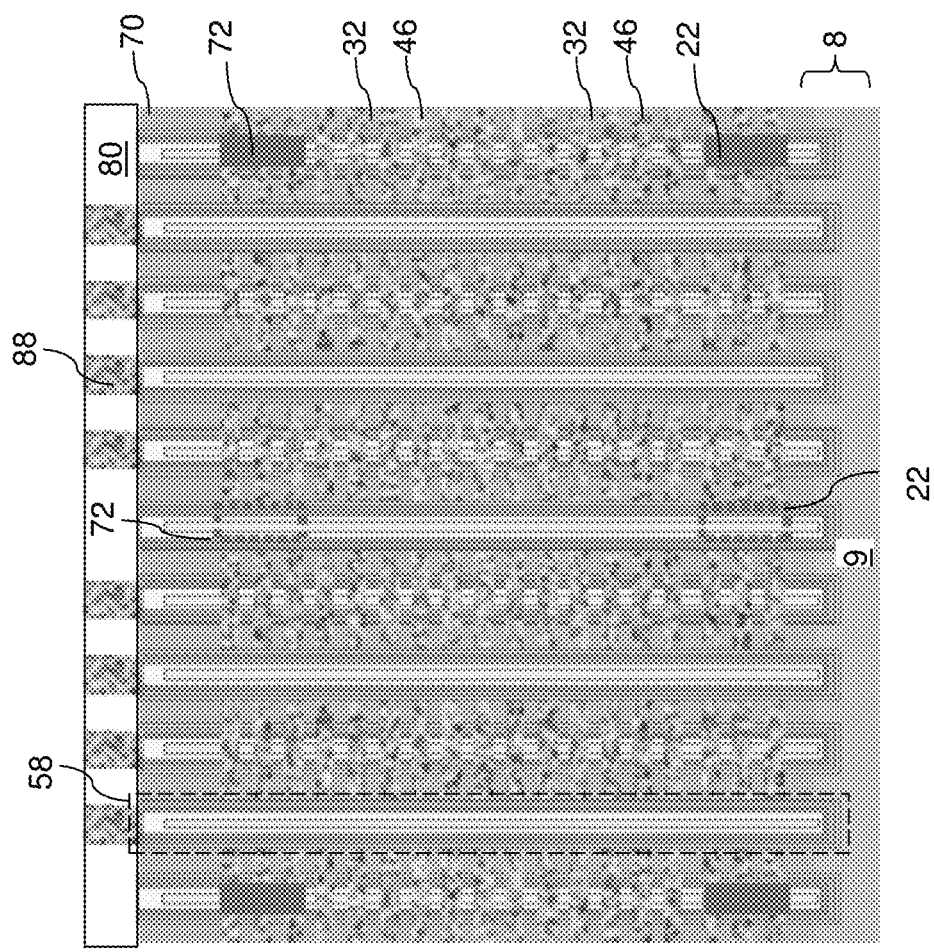
FIG. 7 is a vertical cross-sectional view of a memory array region of the first exemplary structure after formation of a contact-level dielectric layer and drain contact via structures according to the first embodiment of the present disclosure.

Referring to FIG. 7, a contact-level dielectric layer 80 can be deposited over the insulating cap layer 70. The contact-level dielectric layer 80 includes a dielectric material such as silicon oxide, and can have a thickness in a range from 100 nm to 1,000 nm, although lesser and greater thicknesses may also be employed. Various contact via structures can be formed through the contact-level dielectric layer 80. For example, drain contact via structures 88 contacting a respective one of the drain regions 63 can be formed though the contact-level dielectric layer 80. Further, additional contact via structures can be formed, which can include, for example, layer contact via structures (not illustrated) that are formed through the contact-level dielectric layer 80 and a respective retro-stepped dielectric material portion 65 directly on a respective one of the electrically conductive layers 46 in a contact region 200.

Figure 8:
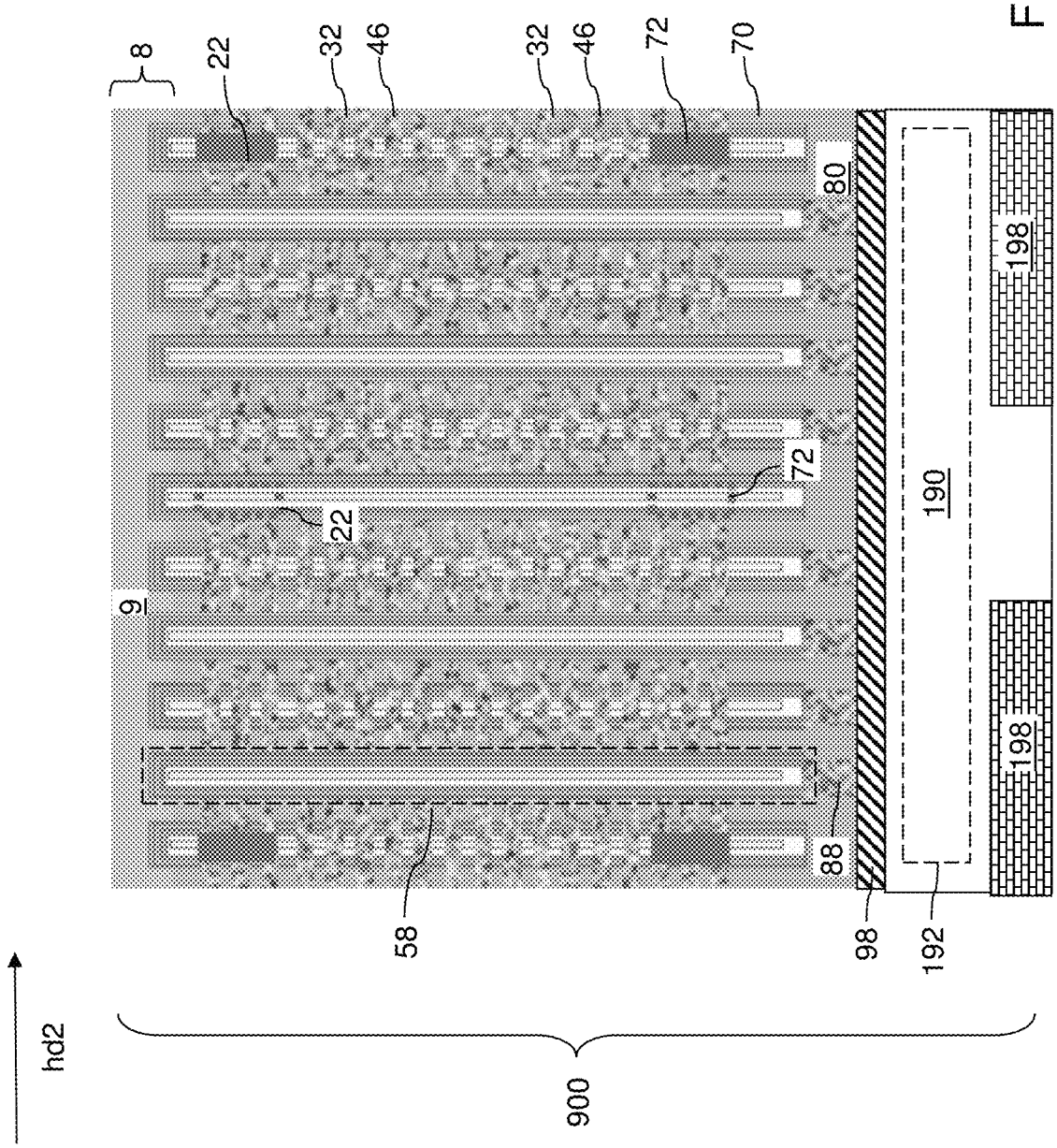
FIG. 8 is a vertical cross-sectional view of a memory array region of the first exemplary structure after formation of memory-side metal interconnect structures embedded in memory-side dielectric material layers and memory-side bonding pads according to the first embodiment of the present disclosure.

Referring to FIG. 8, bit lines 98 laterally extending along the second horizontal direction hd2 can be formed on a respective column of drain contact via structures 88. Memory-side metal interconnect structures 192 embedded in memory-side dielectric material layers 190 can be also formed. The memory-side metal interconnect structures 192 can include various metal lines and various metal via structures. The memory-side dielectric material layers 190 can include various line-level dielectric material layers and various via-level dielectric material layers. In one embodiment, each of the drain regions 63 can be electrically connected to a respective one of the bit lines 98 via a respective drain contact via structure 88. While the schematic FIG. 8 shows a single bit line 98 is shown as apparently contacting all of the drain contact via structures 88, it should be noted that some of the drain contact via structures 88 may not be in the same vertical plane as the bit line 98 and may not contact the bit line 98 shown in FIG. 8. For example, each bit line 98 may electrically contact only one drain contact via structure 88 between each pair of adjacent drain-select-level dielectric isolation structures 72, as shown in the circuit schematic in FIG. 14 and described in more detail below. The dummy memory opening fill structures 58D lack the drain contact via structures 88 and are not electrically connected to the bit lines 98.

Subsequently, memory-side bonding pads 198 can be subsequently formed, which may be embedded in, or may be located on, the memory-side dielectric material layers 190. The memory-side bonding pads 198 can be metallic bonding pads, such as copper pads, and can be electrically connected to a respective one of the memory-side metal interconnect structures 192. The first exemplary structure at the processing steps of FIG. 8 includes a memory die 900.

Figure 9:
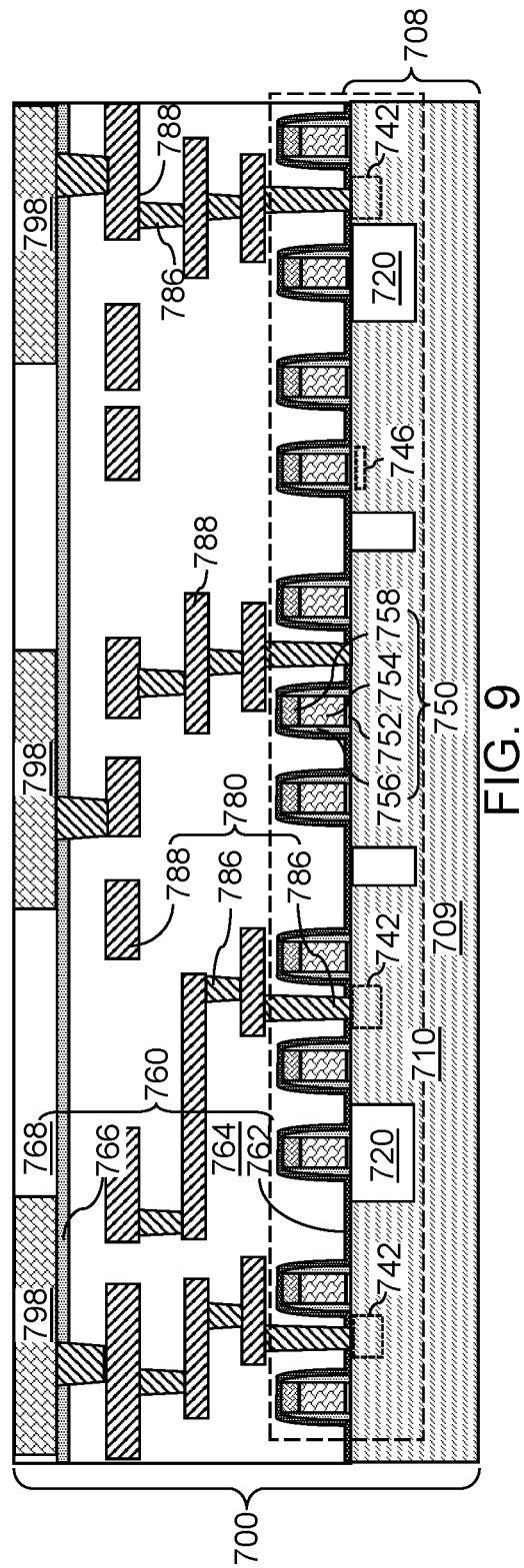
FIG. 9 is a vertical cross-sectional view of a logic die according to the first embodiment of the present disclosure.

Referring to FIG. 9, a logic die 700 according to an embodiment of the present disclosure is illustrated. The logic die 700 can include a logic-die substrate 708 and a peripheral circuit 710 formed thereupon. The logic-die substrate 708 includes a logic-die substrate semiconductor layer 709 at least at an upper portion thereof. Shallow trench isolation structures 720 may be formed in an upper portion of the logic-die substrate semiconductor layer 709 to provide electrical isolation from other semiconductor devices. The peripheral circuit 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758.

Dielectric material layers are formed over the semiconductor devices, which are herein referred to as logic-side dielectric material layers 760. The logic-side dielectric material layers 760 may include, for example, a dielectric liner 762 (such as a silicon nitride liner that blocks diffusion of mobile ions and/or apply appropriate stress to underlying structures), interconnect dielectric layers 764 that overlie the dielectric liner 762, a silicon nitride layer (e.g., hydrogen diffusion barrier) 766 that overlies the interconnect dielectric layers 764, and a bonding-pad-level dielectric layer 768.

The dielectric material layers 760 function as a matrix for metal interconnect structures 780 that provide electrical connection between the peripheral circuit 710 and logic-side bonding pads 798. The logic-side bonding pads 798 are embedded within the bonding-pad-level dielectric layer 768. Each dielectric material layer within the interconnect dielectric layers 764 may include any of doped silicate glass, undoped silicate glass, organosilicate glass, silicon nitride, silicon oxynitride, and dielectric metal oxides (such as aluminum oxide). In one embodiment, the interconnect dielectric layers 764 may comprise, or consist essentially of, dielectric material layers having dielectric constants that do not exceed the dielectric constant of undoped silicate glass (silicon oxide) of 3.9. The logic-side metal interconnect structures 780 are formed within the dielectric layer stack of the logic-side dielectric material layers 760. The logic-side metal interconnect structures 780 may include various metal via structures 786 and various metal line structures 788.

Generally, the logic die 700 includes a peripheral circuit configured to operate memory elements (such as portions of the charge storage layers 54 located at levels of the word-line-level electrically conductive layers 46W) within the memory opening fill structures 58. Further, the logic die 700 comprises logic-side metal interconnect structures 780 embedded in logic-side dielectric material layers 760, and logic-side bonding pads 798 located in or on, logic-side dielectric material layers 760. The logic-side metal interconnect structures 780 are electrically connected to the peripheral circuit 710.

Figure 10:
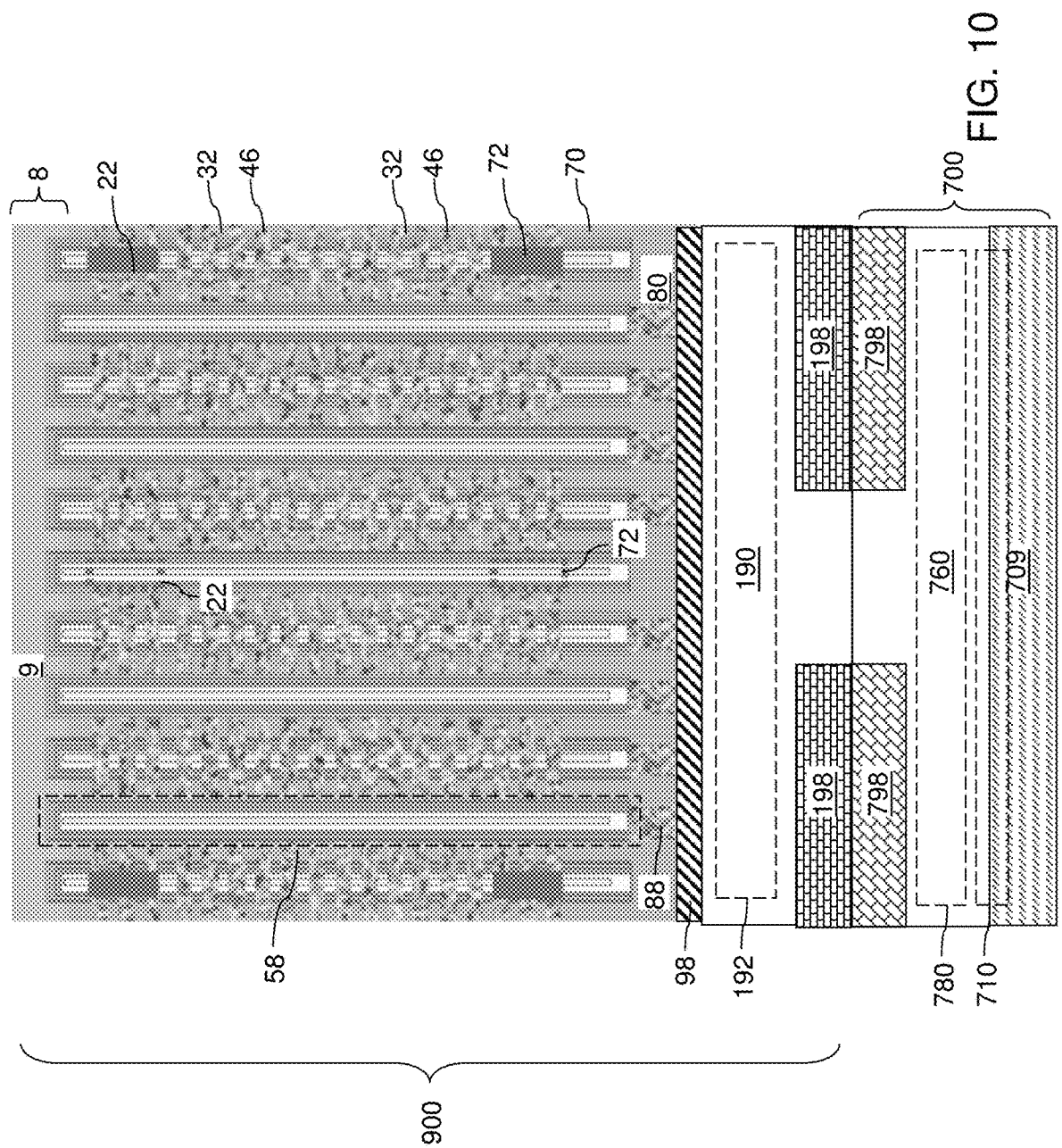
FIG. 10 is a vertical cross-sectional view of the first exemplary structure after bonding the memory die to the logic die according to the first embodiment of the present disclosure.

Referring to FIG. 10, the logic die 700 can be bonded to the memory die 900 such that each of the logic-side bonding pads 798 is bonded to a respective one of the memory-side bonding pads 998. In one embodiment, a metal-to-metal bonding may be employed, in which metallic elements interdiffuse across bonding interfaces between mating pairs of a logic-side bonding pad 798 and a memory-side bonding pad 998. For example, copper-to-copper bonding may be employed to bond the logic die 700 to the memory die 900. Alternatively, C4 bonding employing an array of solder balls may be employed. In this case, the array of solder balls may be interposed between, and can be bonded to, each mating pair of a logic-side bonding pad 798 and a memory-side bonding pad 998. A bonded assembly of a memory die 900 and a logic die 700 can be formed.

Figure 11A:
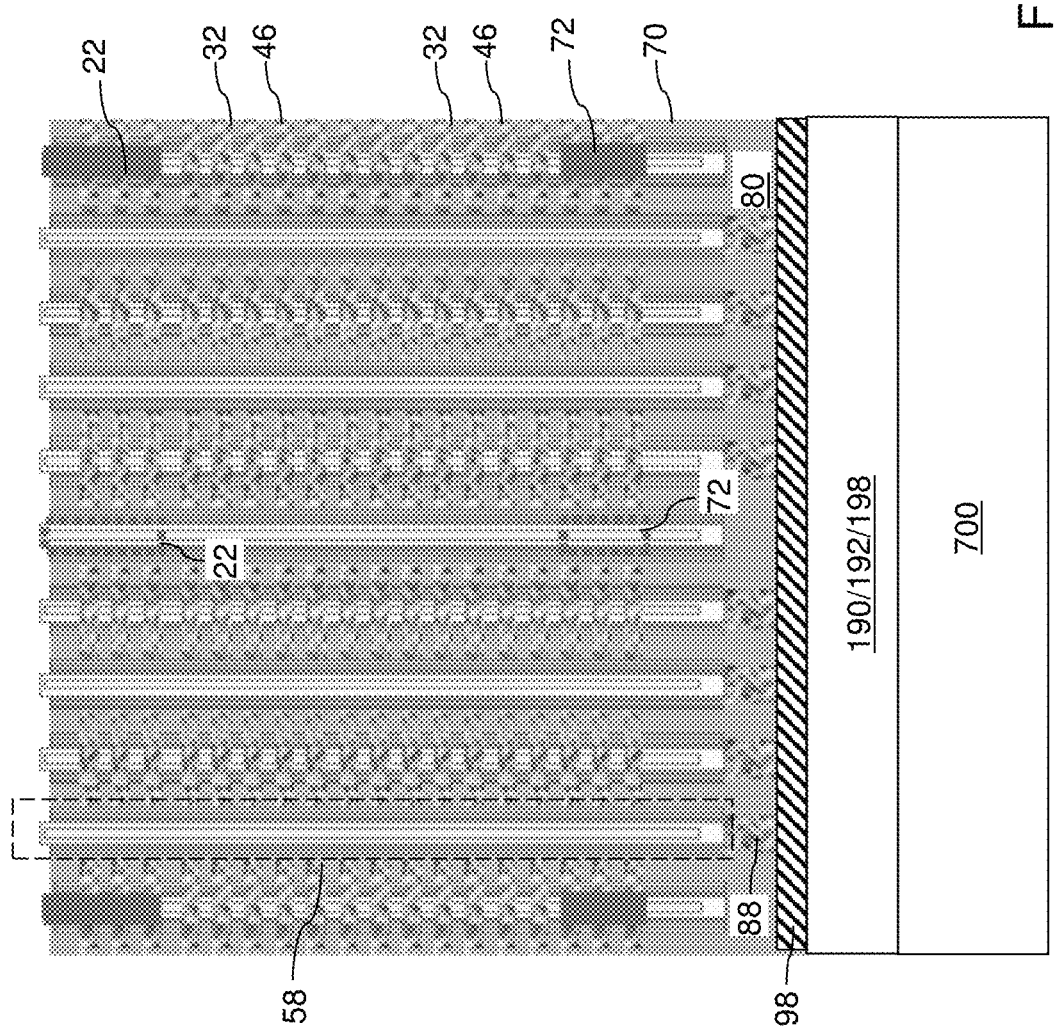
FIG. 11A is a vertical cross-sectional view of the first exemplary structure after removal of the sacrificial substrate according to the first embodiment of the present disclosure.
Figure 11B:
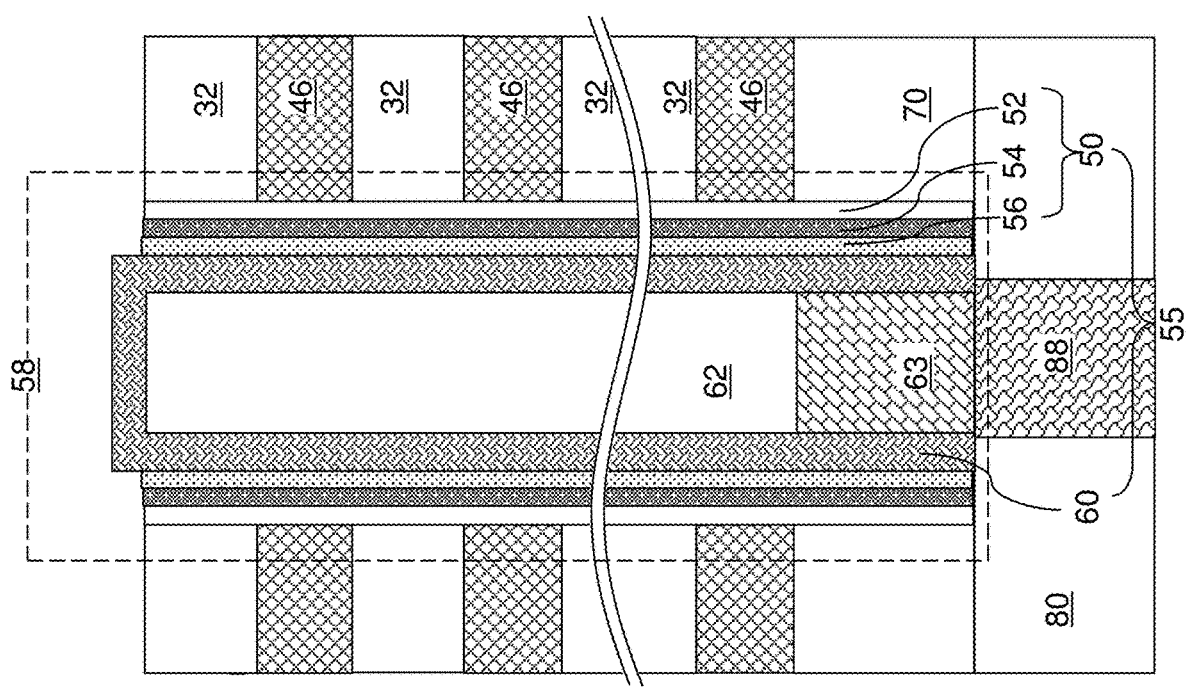
FIG. 11B is a magnified view of a region of the first exemplary structure of FIG. 11A that includes a memory opening fill structure.

Referring to FIGS. 11A and 11B, the sacrificial substrate 8 can be removed selective to the vertical repetition of the insulating layers 32 and the electrically conductive layers 46. For example, if the sacrificial substrate 8 includes a semiconductor substrate, the semiconductor substrate can be thinned by grinding, cleaving, polishing, an isotropic etch process (such as a wet etch process), and/or an anisotropic etch process (such as a reactive ion etch process). Subsequently, a selective etch process can be performed to etch remaining portions of the sacrificial substrate 8 selective to the material of the insulating layers 32 and at least one material within the memory films 50. Subsequently, physically exposed portions of the memory films 50 can be removed selective to the material of the vertical semiconductor channels 60. Surfaces of the vertical semiconductor channels 60 are physically exposed, which are more distal from the logic die 700 than the physically exposed horizontal surface of an insulating layer 32 is from the logic die 700.

Figure 12:
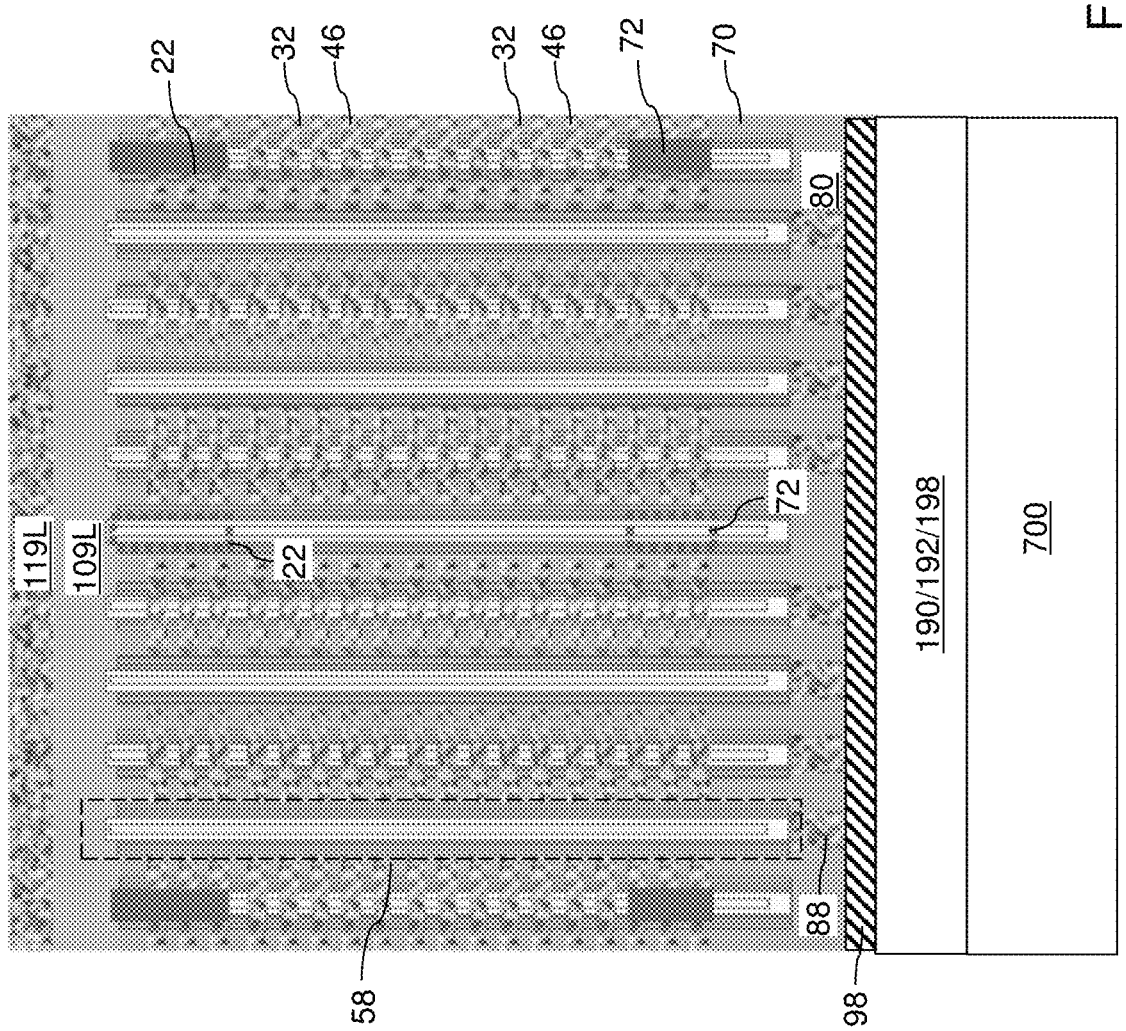
FIG. 12 is a vertical cross-sectional view of the first exemplary structure after formation of a semiconductor source layer and a metallic source layer according to the first embodiment of the present disclosure.

Referring to FIG. 12, a source layer (109L, 119L) can be formed on the physically exposed source-side end surfaces of the vertical semiconductor channels 60. Thus, the sacrificial substrate 8 can be replaced with the source layer (109L, 119L) after bonding the logic die 700 to the memory die 900. In one embodiment, the source layer (109L, 119L) can include a stack of a semiconductor source layer 109L and a metallic source layer (e.g., source line) 119L. In this case, the semiconductor source layer 109L can include a semiconductor material having a doping of the second conductivity type. The thickness of the semiconductor source layer 109L may be in a range from 50 nm to 1,000 nm, such as from 100 nm to 500 nm, although lesser and greater thicknesses may also be employed. The metallic source layer 119L includes, and/or consists essentially of, one or more of a conductive metallic nitride material, a conductive metallic carbide material, an elemental metal, and an intermetallic alloy. The thickness of the metallic source layer 119L can be in a range from 30 nm to 500 nm, such as from 60 nm to 250 nm, although lesser and greater thicknesses may also be employed.

Figure 13:
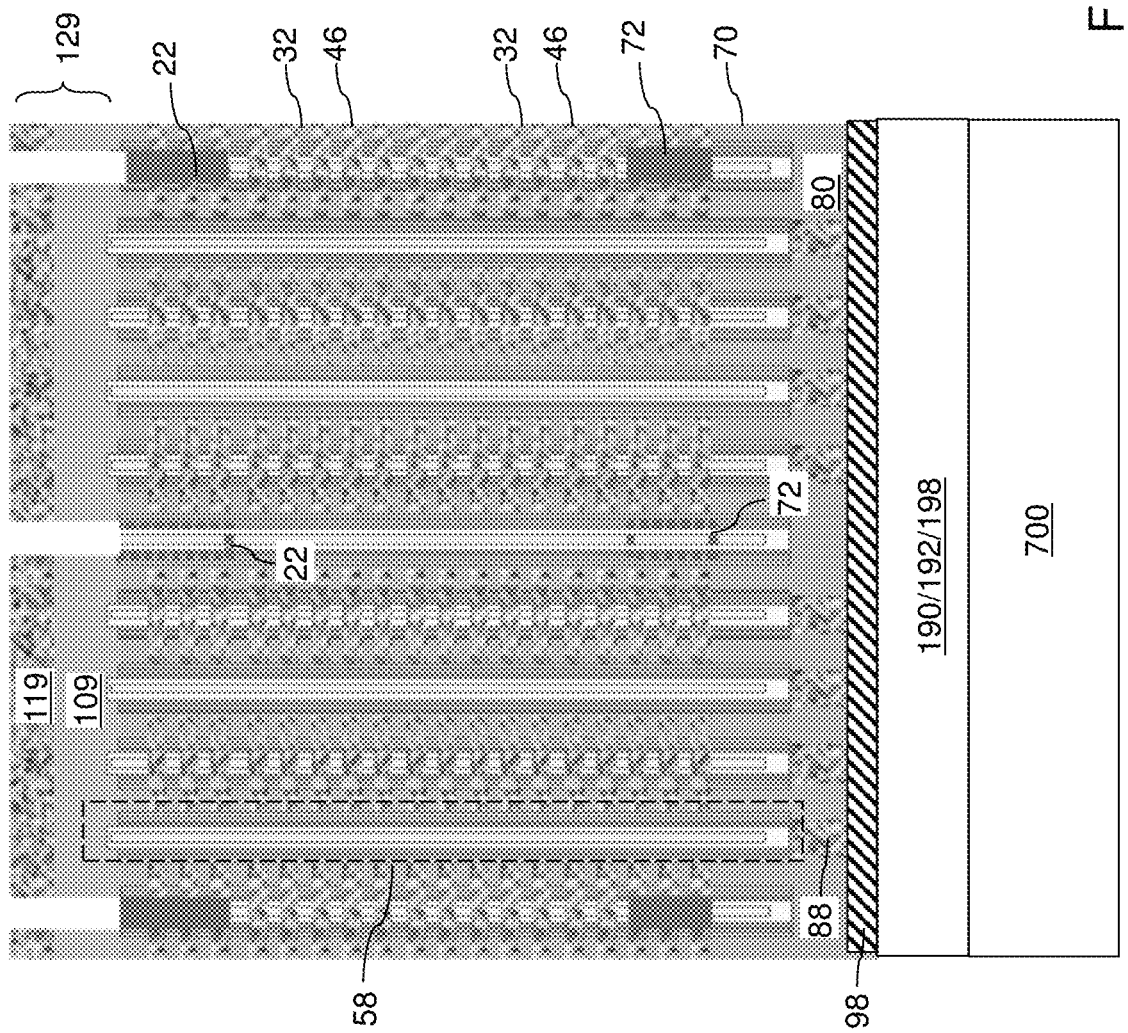
FIG. 13 is a vertical cross-sectional view of the first exemplary structure after dividing the metallic source layer and the semiconductor source layer according to the first embodiment of the present disclosure.

Referring to FIG. 13, a photoresist layer (not shown) can be applied over the source layer (109L, 119L), and can be lithographically patterned to form line trenches in areas that overlie the source-select-level dielectric isolation structures 22. An anisotropic etch process can be performed to transfer the pattern of the line trenches in the photoresist layer through the source layer (109L, 119L). The source layer (109L, 119L) can be divided into source strips 129 (e.g., 109, 119) laterally extending along the first horizontal direction hd1 and laterally spaced apart along the second horizontal direction hd2.

The source strips 129 can be formed on one side of the source-select-level electrically conductive strips 46S, and can overlie, or underlie (if the first exemplary structure is flipped upside down), a respective one of the source-select-level electrically conductive strips 46S, Each of the source strips 129 can have an areal overlap (i.e., overlap in area) with the respective one of the source-select-level electrically conductive strips 46S, and does not have any areal overlap with any other of the source-select-level electrically conductive strips 46S. In one embodiment, each source strip 129 can include a vertical stack of a semiconductor source strip (i.e., source region) 109 that is a patterned portion of the semiconductor source layer 109L and a metallic source strip (i.e., source line) 119 that is a patterned portion of the metallic source layer 119L.

Figure 14:
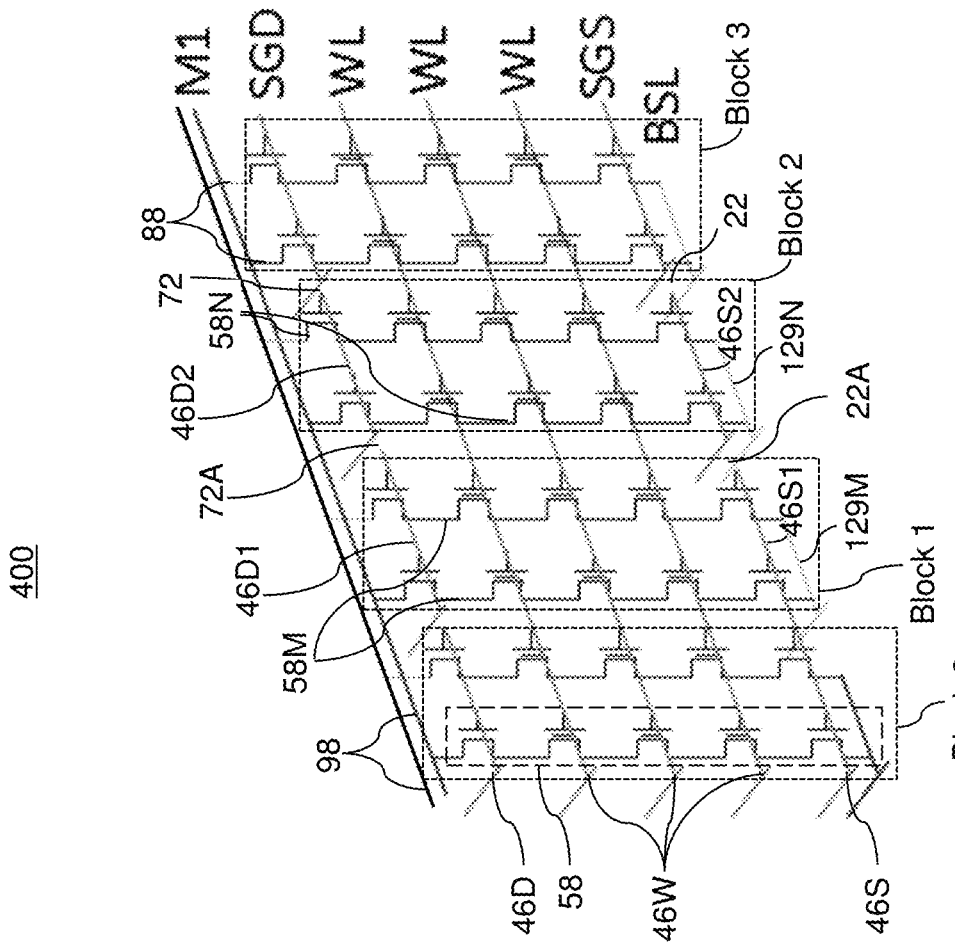
FIG. 14 is a circuit schematic of a portion of the first exemplary structure of FIG. 13.

FIG. 14 is a circuit schematic of a portion of the first exemplary structure of FIG. 13 is illustrated. For example, the portion may include four memory blocks (Blocks 0, 1, 2 and 3) of the same memory plane which share continuous word lines. Each source strip 129 functions as a buried source line BSL, to which source-side ends of a group (e.g., a block) of vertical semiconductor channels 60 (e.g., channels 60 of memory opening fill structures which comprise vertical NAND strings 58) located between a neighboring pair of source-select-level dielectric isolation structures 22 are electrically connected. Each source-select-level electrically conductive strip 46S can laterally surround a respective group (e.g., block) of vertical semiconductor channels 60 that is electrically connected to a respective one of the source strips (109, 119), and functions as a source-side select gate electrode SGS for a particular memory block. Each word-line-level electrically conductive layer 46W functions as a word line that laterally surrounds multiple groups (i.e., multiple blocks) of vertical semiconductor channels 60 that are electrically connected to multiple buried source lines BSL. Each drain-select-level electrically conductive strip 46D can laterally surround a respective group (e.g., block) of vertical semiconductor channels 60 (e.g., vertical NAND strings) that is electrically connected to a respective one of the source strips 129, and functions as a drain-side select gate electrode SGD. Each bit line M1 can be connected to a respective set of drain regions 63, such as one drain region in each block. Each drain region 63 within a set of drain regions 63 connected to a same bit line M1 can located in different blocks and can be electrically connected to a vertical semiconductor channel 60 that extends through different drain-select-level electrically conductive strips 46D or through different source-select-level electrically conductive strips 46S. Thus, each word line WL extends uncut through plural memory blocks in the same memory plane. This reduces the number of word line switching transistors in the peripheral die 700 and decreases the size of the word line switching circuit compared to a memory device which requires a separate word line switching transistor for each word line of each memory block. However, the source-side select gate electrodes and the drain-side select gate electrode are electrically separated between each memory block by respective structures 22 and 72.

Referring to FIG. 14, the three-dimensional memory device comprises a memory plane 400 containing a first memory block (e.g., Block 1) and a second memory block (e.g., Block 2) located adjacent to the first memory block. The first memory block comprises at least one first source side select gate electrode 46S1, at least one first drain side select gate electrode 46D1, a plurality of word lines 46W located between the at least one first source side select gate electrode 46S1 and at least one first drain side select gate electrode 46D1, and a plurality of first vertical NAND strings (e.g., the memory opening fill structures) 58M extending through the at least one first source side select gate electrode, the plurality of word lines and the at least one first drain side select gate electrode. The second memory block comprises at least one second source side select gate electrode 46S2, at least one second drain side select gate electrode 46D2, the plurality of word lines 46W located between the at least one second source side select gate electrode 46S1 and at least one second drain side select gate electrode 46D2, and a plurality of second vertical NAND strings 58N extending through the at least one second source side select gate electrode, the plurality of word lines and the at least one second drain side select gate electrode. The memory plane 400 further comprises a source-select-level dielectric isolation structure 22A located between the least one first source side select gate electrode 46S1 and the least one second source side select gate electrode 46S2, and a drain-select-level dielectric isolation 72A structure located between the least one first drain side select gate electrode 46D1 and the least one second drain side select gate electrode 46D2. The plurality of word lines 46W extend continuously between the first memory block and the second memory block.

The memory plane 400 also includes first source strip 129M and second source strip 129N, wherein each of the first and the second source strips has an areal overlap with a respective one of the first and second source side select gate electrodes 46S1 and 46S2. The memory plane 400 lacks trenches which separate the word lines 46W of the first memory block and the second memory block. Each of the first and second vertical NAND strings (58M, 58N) comprises a respective memory film 50, a respective drain region 63, and a respective vertical semiconductor channel 63 having a source-side end contacting the respective first or second source strip (129M, 129N).

In one embodiment, there may be four rows of offset vertical NAND strings 58 extending in the word line direction hd1 in each memory block. However, there may be one, two, three or more than four rows of vertical NAND strings 58 in each memory block.

Figure 15:
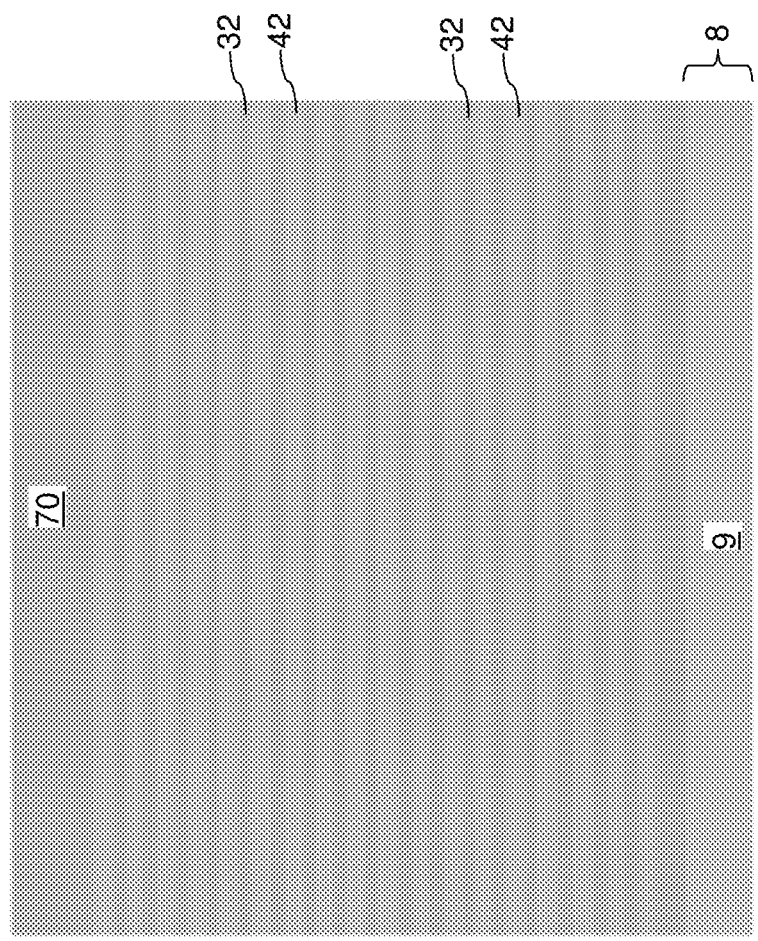
FIG. 15 is a vertical cross-sectional view of a second exemplary structure after formation of a vertical repetition of unit layer stacks over a sacrificial substrate and an insulating cap layer according to a second embodiment of the present disclosure.

Referring to FIG. 15, a second exemplary structure according to a second embodiment of the present disclosure can be derived from the first exemplary structure of FIGS. 1A-1D by omitting formation of source-select-level dielectric isolation structures 22 and by omitting formation of the drain-select-level dielectric isolation structures 72. In this case, each of the spacer material layers 42 and the insulating layers 32 may be formed as an unpatterned continuous material layer.

Figure 16:
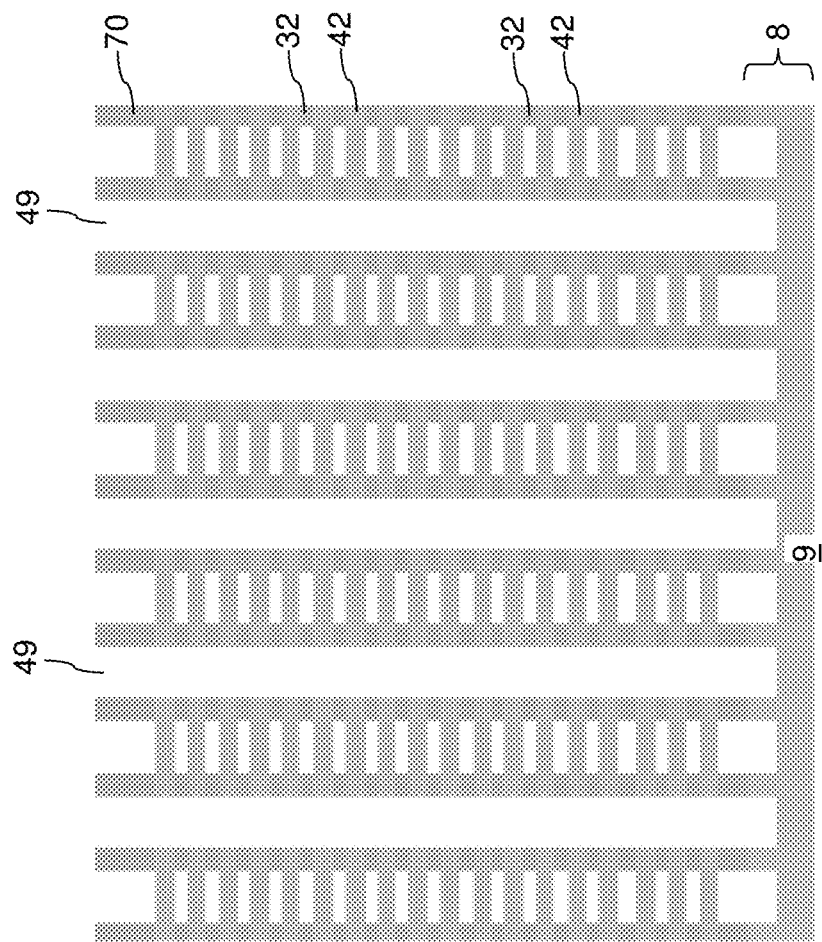
FIG. 16 is a vertical cross-sectional view of the second exemplary structure after formation of memory openings according to the second embodiment of the present disclosure.

Referring to FIG. 16, the processing steps of FIGS. 2A-2C and 3A-3D can be performed to form stepped surfaces, at least one retro-stepped dielectric material portion 65 (not illustrated), memory openings 49, and boundary openings (not illustrated).

Figure 17:
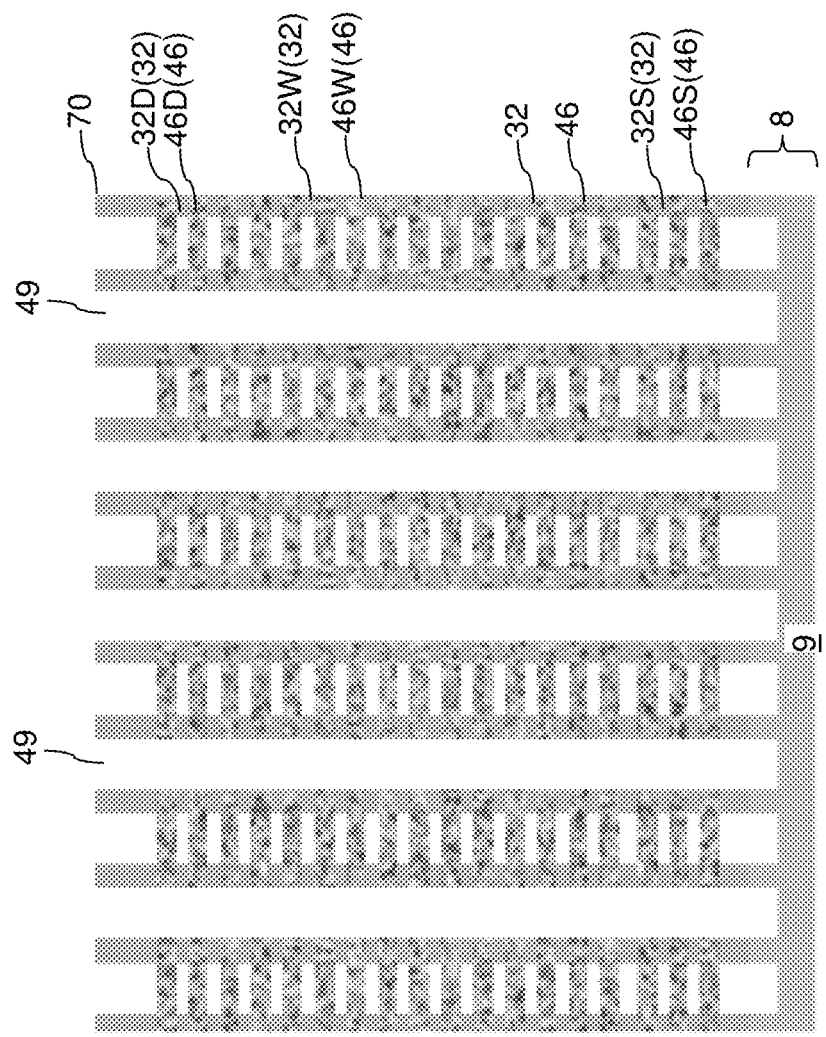
FIG. 17 is a vertical cross-sectional view of the second exemplary structure after formation of electrically conductive layers according to the second embodiment of the present disclosure.

Referring to FIG. 17, the processing steps of FIGS. 4A-4H may be performed to form at least one perforated dielectric wall structure 16 (not illustrated). Subsequently, the processing steps of FIG. 5 may be performed to form electrically conductive layers 46 in place of spacer material layers 42 in case the spacer material layers 42 are not formed as electrically conductive layers. In case the spacer material layers 42 are formed as electrically conductive layers, replacement of the spacer material layers 42 with the electrically conductive layers 46 is not necessary.

The electrically conductive layers 46 comprise a first subset, a second subset, and a third subset. The first subset of the electrically conductive layers 46 can be provided at source select levels, and comprises source-select-level electrically conductive layers 46S. The second subset of the electrically conductive layers 46 can be provided at word line levels, and comprises word-line-level electrically conductive layers 46W that function as word lines for a three-dimensional memory array to be subsequently formed. The third subset of the electrically conductive layers 46 can be provided at drain select levels, and comprises drain-select-level electrically conductive layers 46D. The insulating layers 32 comprise source-select-level insulating layers 32S, word-line-level insulating layers 32W, and drain-select-level insulating layers 32D.

Figure 18A:
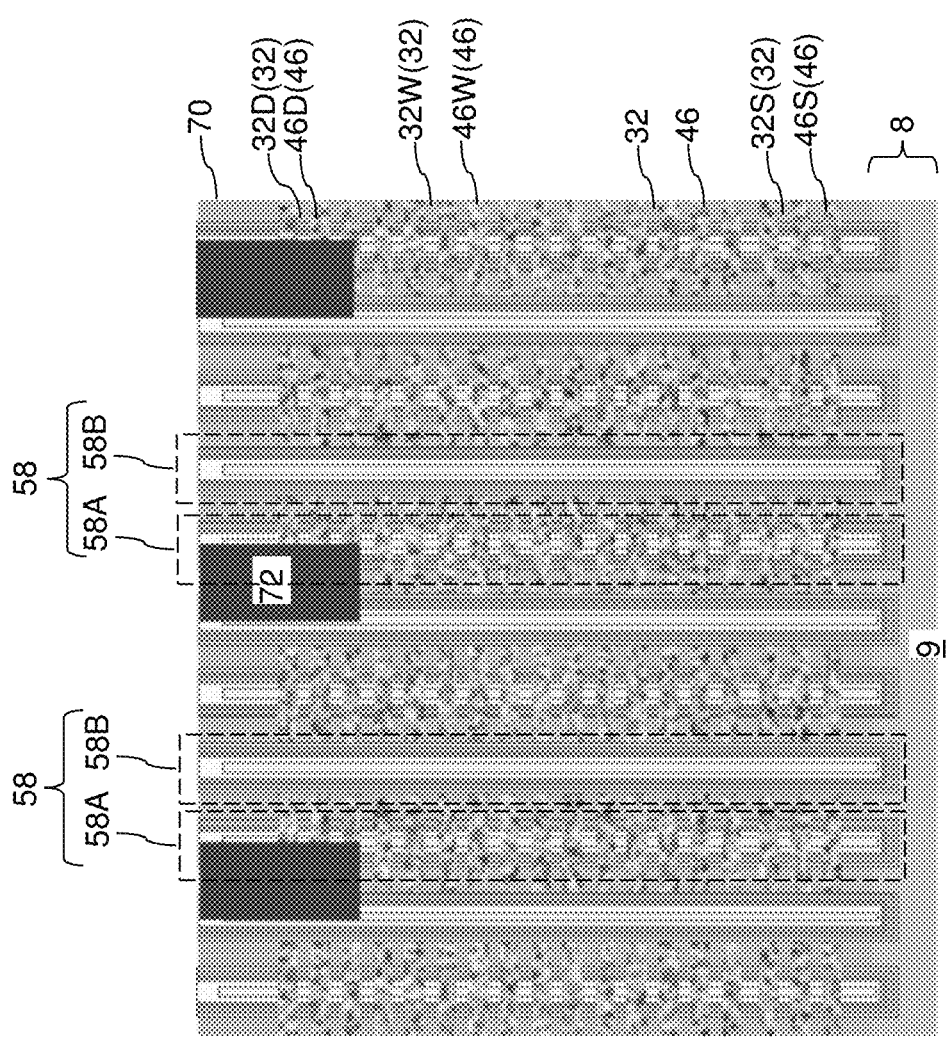
FIG. 18A is a vertical cross-sectional view of the second exemplary structure after formation of drain-select-level dielectric isolation structures according to the second embodiment of the present disclosure.
Figure 18B:
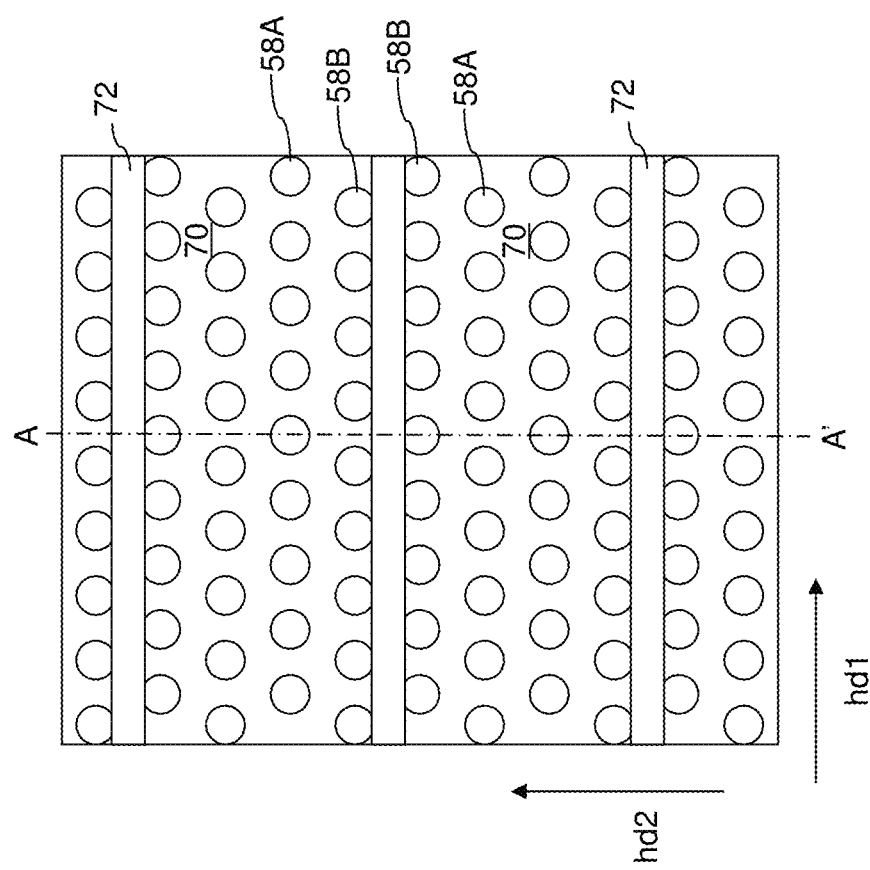
FIG. 18B is a see-through top-down view of the second exemplary structure of FIG. 18A.

Referring to FIGS. 18A and 18B, the processing steps of FIGS. 6A and 6B can be performed to form a memory opening fill structure 58 within each memory opening 49. In this embodiment, the dummy memory opening fill structures 58D may be omitted. Subsequently, drain-select-level line trenches laterally extending along the first horizontal direction hd1 and laterally spaced apart along the second horizontal direction hd2 can be formed through the drain-select-level electrically conductive layers 46D and the drain-select-level insulating layers 32D. The width of each drain-select-level line trench along the second horizontal direction hd2 may be on the order of the lateral dimension (such as a diameter) of memory openings to be subsequently formed. The spacing between neighboring pair of drain-select-level line trenches along the second horizontal direction hd2 may be in a range from 2 times the lateral dimension of each memory opening to be subsequently formed to 16 times the lateral dimension of each memory opening to be subsequently formed.

The drain-select-level line trenches may partially cut a first subset of the memory opening fill structures 58, as shown in FIG. 18B. Thus, a first subset 58A of the memory opening fill structures 58 has a horizontal cross sectional shape of a portion of a circle at the vertical levels of the drain-select-level electrically conductive layers 46D, and a horizontal cross sectional shape of a portion of a full circle (i.e., a cylindrical shape) at the vertical levels of the word-line-level electrically conductive layers 46W. In contrast, a second subset 58B of the memory opening fill structures 58 that is not cut by the drain-select-level line trenches has a horizontal cross sectional shape of a full circle (i.e., cylindrical shape) at the vertical levels of both the drain-select-level electrically conductive layers 46D and the word-line-level electrically conductive layers 46W. The drain-select-level line trenches can be subsequently filled with a dielectric fill material such as silicon oxide to form drain-select-level dielectric isolation structures 72.

Figure 19:
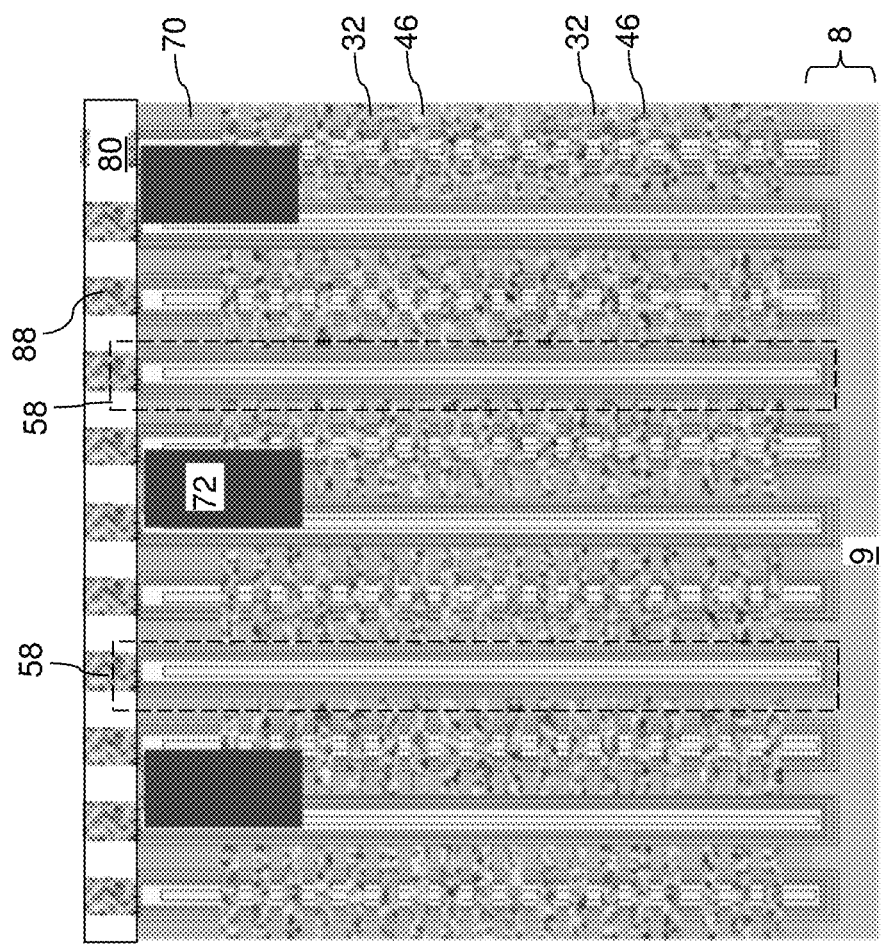
FIG. 19 is a vertical cross-sectional view of the second exemplary structure after formation of a contact-level dielectric layer and drain contact via structures according to the second embodiment of the present disclosure.

Referring to FIG. 19, the processing steps of FIG. 7 can be performed to form a contact-level dielectric layer 80 and drain contact via structures 88.

Figure 20:
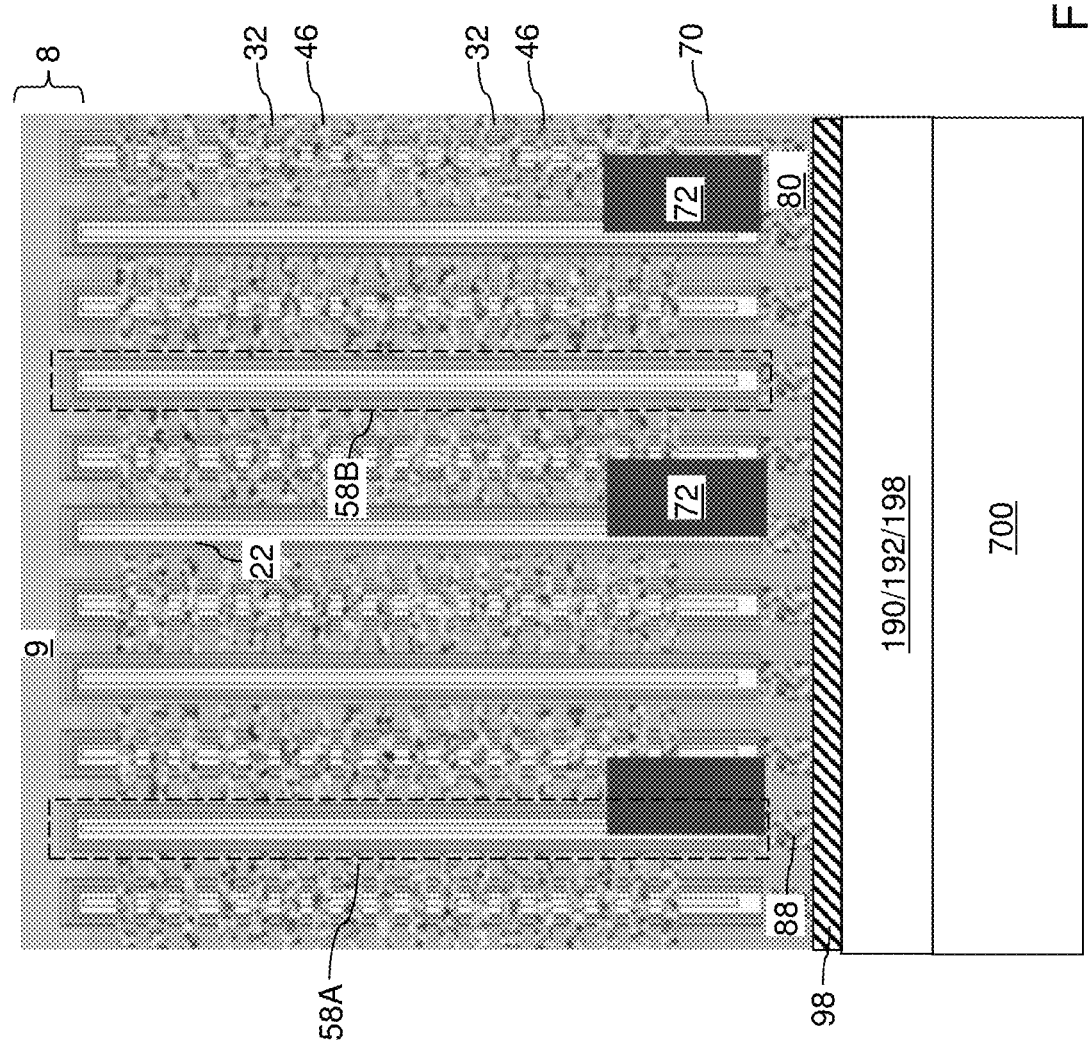
FIG. 20 is a vertical cross-sectional view of the second exemplary structure after bonding the memory die to a logic die according to the second embodiment of the present disclosure.

Referring to FIG. 20, the processing steps of FIG. 8 can be performed to form the bit lines 98 laterally extending along the second horizontal direction hd2 on a respective column of drain contact via structures 88. Memory-side metal interconnect structures 192 embedded in memory-side dielectric material layers 190 can be formed. The memory-side metal interconnect structures 192 can include various metal lines and various metal via structures. The memory-side dielectric material layers 190 can include various line-level dielectric material layers and various via-level dielectric material layers. In one embodiment, each of the drain regions 63 can be electrically connected to a respective one of the bit lines via a respective drain contact via structure 88. Subsequently, memory-side bonding pads 198 can be subsequently formed, which may be embedded in, or may be located on, the memory-side dielectric material layers 190. The memory-side bonding pads 198 can be metallic bonding pads such as copper pads, and can be electrically connected to a respective one of the memory-side metal interconnect structures 192. A memory die 900 is provided.

A logic die 700 illustrated in FIG. 9 can be provided, and can be bonded to the memory die 900 to form a bonded assembly including a memory die 900 and a logic die 700.

Figure 21:
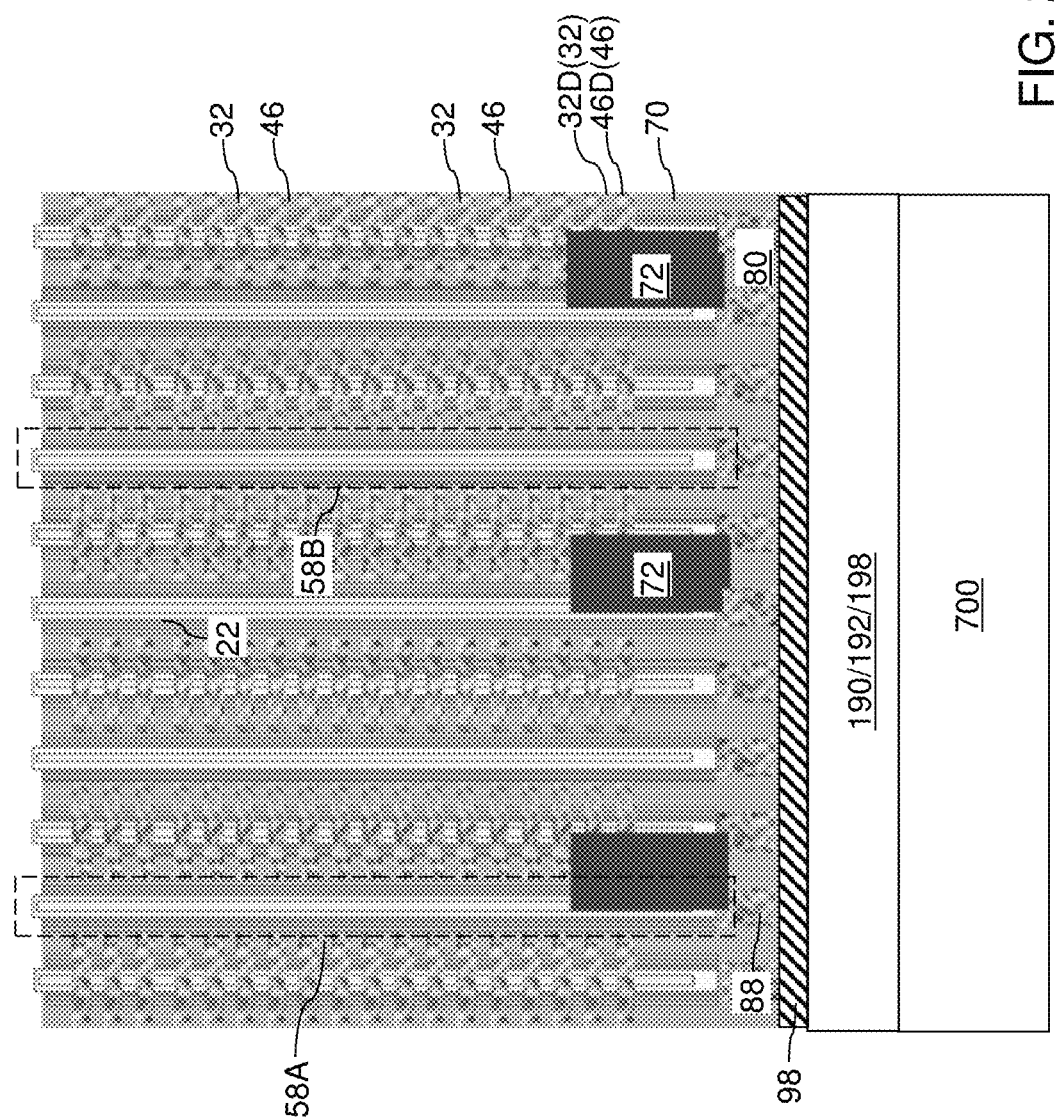
FIG. 21 is a vertical cross-sectional view of the second exemplary structure after removal of the sacrificial substrate according to the second embodiment of the present disclosure.

Referring to FIG. 21, the processing steps of FIG. 11 can be performed to remove the sacrificial substrate 8 and to physically expose source-side end surfaces of the vertical semiconductor channels 60.

Figure 22:
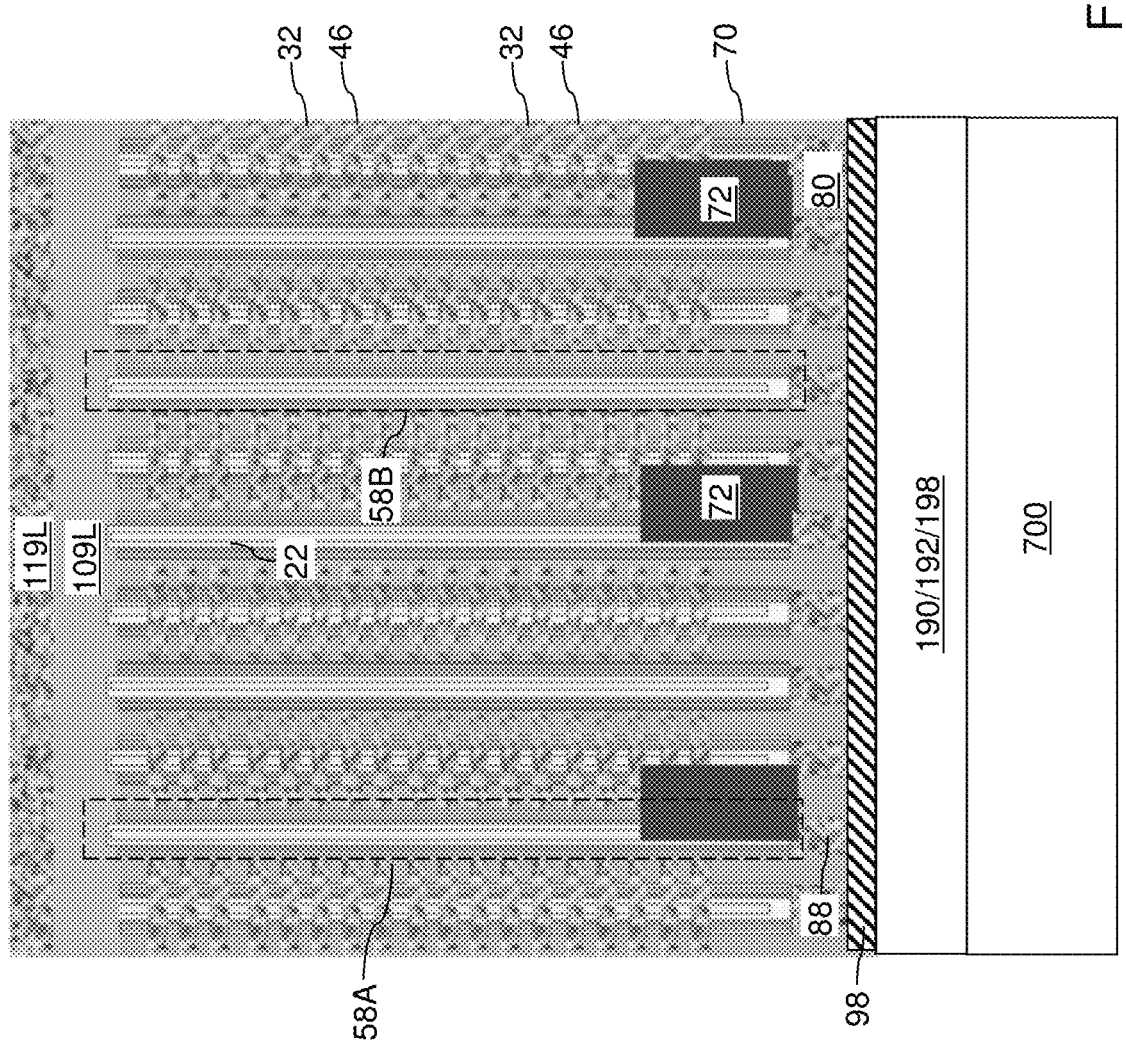
FIG. 22 is a vertical cross-sectional view of the second exemplary structure after formation of a semiconductor source layer and a metallic source layer according to the second embodiment of the present disclosure.

Referring to FIG. 22, the processing steps of FIG. 12 can be performed to form a source layer (109L, 119L) on the physically exposed source-side end surfaces of the vertical semiconductor channels 60. Thus, the sacrificial substrate 8 can be replaced with the source layer (109L, 119L) after bonding the logic die 700 to the memory die 900. In one embodiment, the source layer (109L, 119L) can include a stack of a semiconductor source layer 109L and a metallic source layer 119L. In this case, the semiconductor source layer 109L can include a semiconductor material having a doping of the second conductivity type. The thickness of the semiconductor source layer 109L may be in a range from 50 nm to 1,000 nm, such as from 100 nm to 500 nm, although lesser and greater thicknesses may also be employed. The metallic source layer 119L includes, and/or consists essentially of, one or more of a conductive metallic nitride material, a conductive metallic carbide material, an elemental metal, and an intermetallic alloy. The thickness of the metallic source layer 119L can be in a range from 30 nm to 500 nm, such as from 60 nm to 250 nm, although lesser and greater thicknesses may also be employed.

Figure 23B:
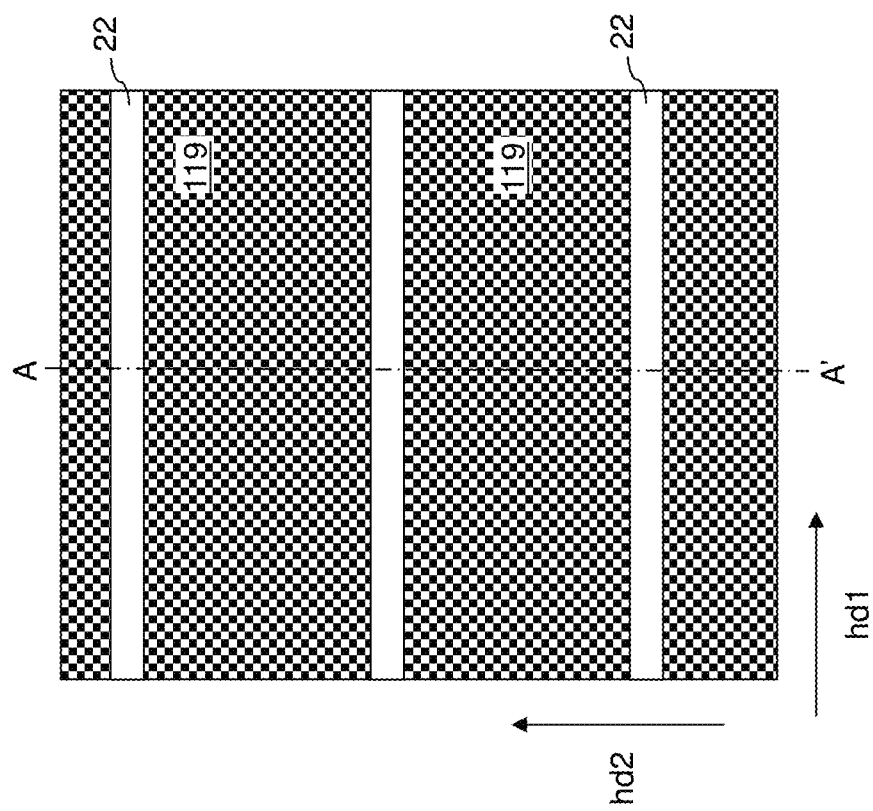
FIG. 23B is a top-down view of the second exemplary structure of FIG. 23A.

Referring to FIGS. 23A and 23B, a photoresist layer (not shown) can be applied over the source layer (109L, 119L), and can be lithographically patterned to form line trenches in areas that overlie the source-select-level dielectric isolation structures 22. An anisotropic etch process can be performed to transfer the pattern of the line trenches in the photoresist layer through the source layer (109L, 119L), the source-select-level electrically conductive layers 46S, and the source-select-level insulating layers 32S. The source layer (109L, 119L) can be divided into source strips (109, 119) laterally extending along the first horizontal direction hd1 and laterally spaced apart along the second horizontal direction hd2. Each source-select-level electrically conductive layers 46S is divided into multiple portions, which are herein referred to as source-select-level electrically conductive strips 46S. Each source-select-level insulating layers 32S is divided into multiple portions, which are herein referred to as source-select-level insulating strips 32S.

The source strips (109, 119) can be formed on one side of the source-select-level electrically conductive strips 46S, and can overlie, or underlie (if the first exemplary structure is flipped upside down), a respective one of the source-select-level electrically conductive strips 46S, Each of the source strips (109, 119) can have an areal overlap with the respective one of the source-select-level electrically conductive strips 46S, and does not have any areal overlap with any other of the source-select-level electrically conductive strips 46S. In one embodiment, each source strip (109, 119) can include a vertical stack of a semiconductor source strip 109 that is a patterned portion of the semiconductor source layer 109L and a metallic source strip 119 that is a patterned portion of the metallic source layer 119L.

In one embodiment, the source-select-level electrically conductive layers 46S can be divided into source-select-level electrically conductive strips 46S by continuing the etching after dividing the source layer (109L, 119L) into the source strips (109, 119). The photoresist layer can be removed, for example, by ashing.

The etching forms source-select-level line trenches which separate adjacent source-select-level electrically conductive strips 46S. The source-select-level line trenches may partially cut the first subset 58A of the memory opening fill structures 58, as shown in FIG. 23B. Thus, the first subset 58A of the memory opening fill structures 58 has a horizontal cross sectional shape of a portion of a circle at the vertical levels of the source-select-level electrically conductive layers 46S, and a horizontal cross sectional shape of a portion of a full circle (i.e., a cylindrical shape) at the vertical levels of the word-line-level electrically conductive layers 46W. In contrast, a second subset 58B of the memory opening fill structures 58 that is not cut by the source-select-level line trenches has a horizontal cross sectional shape of a full circle (i.e., cylindrical shape) at the vertical levels of both the source-select-level electrically conductive layers 46S and the word-line-level electrically conductive layers 46W.

The source-select-level line trenches can be subsequently filled with a dielectric fill material such as silicon oxide to form source-select-level dielectric isolation structures 22. Specifically, dielectric fill material such as silicon oxide can be deposited into the trenches located between neighboring pairs of source-select-level electrically conductive strips 46S and between neighboring pairs of source strips (109, 119). Excess portions of the dielectric fill material can be removed from above the horizontal plane including the physically exposed planar surfaces of the source strips (109, 119). Remaining portions of the dielectric fill material comprise source-select-level dielectric isolation structures 22. Generally, source-select-level dielectric isolation structures 22 can be formed by depositing a dielectric fill material within trenches formed between the source strips (109, 119) during dividing a subset of the electrically conductive layers 46 (which comprise source-select-level electrically conductive layers) into the source-select-level electrically conductive strips 46S.

In one embodiment, the source-select-level dielectric isolation structures 22 can have planar surfaces within a horizontal plane including physically exposed horizontal surfaces of the source strips (109, 119). In one embodiment, the source-select-level insulating strips 32S laterally extend along the first horizontal direction hd1, and are laterally spaced apart along the second horizontal direction hd2 by the source-select-level dielectric isolation structures 22.

In one embodiment, sidewalls of the source strips (109, 119) contact sidewalls of the source-select-level dielectric isolation structures 22, and each sidewall of the source-select-level dielectric isolation structures 22 extends straight along a vertical direction from a respective planar surface located within the horizontal plane including horizontal surfaces of the source strips (109, 119) to a surface of one of the insulating layers (such as the word-line-level insulating layers 32W) within an alternating stack of word-line-level electrically conductive layers 46W and the insulating layers (such as the word-line-level insulating layers 32W).

In the embodiments of the present disclosure, continuous trenches which extend in the word line direction hd1 and separate adjacent memory blocks may be omitted. This reduces the process cost by omitting the high aspect ratio RIE step used to form the trenches. Furthermore, the chip size may be reduced and active device density may be increased by forming NAND strings in the area typically occupied by the trenches. Still further, the substrate warpage caused by a metal local interconnect in the trenches and pattern collapse into the trenches may be avoided. Finally, the area and number of word line switching transistors may be reduced by extending the word lines through plural memory blocks in the same memory plane instead of using separate word lines in each memory block separated by the trenches.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising a memory die, wherein the memory die comprises:
   source-select-level electrically conductive strips laterally extending along a first horizontal direction and laterally spaced apart along a second horizontal direction by source-select-level dielectric isolation structures;
   drain-select-level electrically conductive strips laterally extending along the first horizontal direction and laterally spaced apart along the second horizontal direction by drain-select-level dielectric isolation structures;
   an alternating stack of word-line-level electrically conductive layers and insulating layers located between the source-select-level electrically conductive strips and the drain-select-level electrically conductive strips;
   source strips, wherein each of the source strips has an areal overlap with a respective one of the source-select-level electrically conductive strips, and the source-select-level electrically conductive strips are located between the source strips and the alternating stack; and
   memory opening fill structures vertically extending through the alternating stack, the source-select-level electrically conductive strips and the drain-select-level electrically conductive strips, wherein each of the memory opening fill structures comprises a respective memory film, a respective drain region, and a respective vertical semiconductor channel having a source-side end contacting a respective source strip;
   wherein each of the source strips is in direct contact with end portions of a plurality of vertical semiconductor channels within the memory opening fill structures; and
   wherein one of the source-select-level dielectric isolation structures directly contacts vertical sidewalls of at least two of the memory opening fill structures.

2. The semiconductor structure of claim 1, further comprising a logic die that is bonded to the memory die, wherein:
   the logic die comprises a peripheral circuit configured to control operation of memory elements within the memory stack structures;
   the memory die further comprises memory-side bonding pads; and
   the logic die further comprises logic-side bonding pads that are bonded to a respective one of the memory-side bonding pads.

3. The semiconductor structure of claim 2, wherein:
   the memory die further comprises memory-side metal interconnect structures embedded in memory-side dielectric material layers;
   each of the drain regions is electrically connected to a respective one of the memory-side metal interconnect structures;
   the memory-side bonding pads are embedded in or are located on the memory-side dielectric material layers;
   the logic die further comprises logic-side metal interconnect structures embedded within logic-side dielectric material layers and electrically connected to the peripheral circuit; and
   the logic-side bonding pads are embedded in or are located on the logic-side dielectric material layers.

4. The semiconductor structure of claim 1, further comprising a pair of perforated dielectric wall structures laterally extending along the first horizontal direction and spaced apart along the second horizontal direction, wherein each of the perforated dielectric wall structures comprises a row of openings at each level of the insulating layers and extends continuously along the first horizontal direction at each level of the word-line-level electrically conductive layers, and wherein each portion of the perforated dielectric wall structures located at a respective level of the word-line-level electrically conductive layers comprises a pair of laterally undulating sidewalls having a respective set of vertically straight and laterally convex sidewall segments that are adjoined to each other.

5. The semiconductor structure of claim 1, further comprising source-select-level insulating strips laterally extending along the first horizontal direction, laterally spaced apart along the second horizontal direction by the source-select-level dielectric isolation structures, and vertically offset from the source-select-level electrically conductive strips.

6. The semiconductor structure of claim 1, wherein:
   the source-select-level dielectric isolation structures have planar surfaces within a horizontal plane including horizontal surfaces of the source strips;
   sidewalls of the source strips contacts sidewalls of the source-select-level dielectric isolation structures; and
   each sidewall of the source-select-level dielectric isolation structures extends straight along a vertical direction from a respective planar surface located within the horizontal plane including horizontal surfaces of the source strips to a surface of one of the insulating layers within the alternating stack.

7. The semiconductor structure of claim 1, wherein sidewalls of the vertical semiconductor channels of the at least two of the memory opening fill structures and sidewalls of the memory films of the at least two of the memory opening fill structures are in direct contact with a respective sidewall of said one of the source-select-level dielectric isolation structures, the sidewalls of the vertical semiconductor channels of said at least two memory opening fill structures and the sidewalls of the memory films of said at least two memory opening fill structures being parallel to the first horizontal direction.

8. The semiconductor structure of claim 1, wherein:
   said one of the source-select-level dielectric isolation structures comprises a horizontally-extending surface that contacts one of the insulating layers in the alternating stack, surface segments of the vertical semiconductor channels of the at least two memory opening fill structures, and surface segments of the memory films of the at least two memory opening fill structures; and
   an entirety of the horizontally-extending surfaces is more distal from a horizontal plane including interfaces between the source strips and the vertical semiconductor channels of the at least two memory opening fill structures than any of the source-select-level electrically conductive strips is from the horizontal plane.

9. The semiconductor structure of claim 1, wherein:
   each of the memory opening fill structures comprises a respective dielectric core that is laterally surrounded by the respective vertical semiconductor channel; and
   each sidewall of said one of the source-select-level dielectric isolation structures extends straight between a horizontal plane including interfaces between the source strips and the vertical semiconductor channels of the at least two memory opening fill structures and one of the insulating layers in the alternating stack, and contacts at least one dielectric core within the dielectric cores of the at least two memory opening fill structures.

10. The semiconductor structure of claim 1, wherein each of the vertical semiconductor channels of the at least two memory opening fill structures is in direct contact with a respective one of the source strips.

11. The semiconductor structure of claim 1, further comprising source-select-level insulating strips located between the source-select-level electrically conductive strips and the source strips, wherein each of the vertical semiconductor channels of the at least two memory opening fill structures comprises a surface segment that is more distal from the alternating stack than the source strips are from the alternating stack, and is electrically isolated from each of the source strips.

12. The three-dimensional memory device of claim 1, wherein each of the source strips has a lateral extent along the second horizontal direction that is the same as a lateral spacing along the second horizontal direction between a neighboring pair of the source-select-level dielectric isolation structures.

13. A three-dimensional memory device, comprising:
a memory plane containing a first memory block and a second memory block located adjacent to the first memory block, wherein:
the first memory block comprises at least one first source side select gate electrode, at least one first drain side select gate electrode, a plurality of word lines located between the at least one first source side select gate electrode and at least one first drain side select gate electrode, and a plurality of first vertical NAND strings comprising first memory opening fill structures and extending through the at least one first source side select gate electrode, the plurality of word lines and the at least one first drain side select gate electrode; and
the second memory block comprises at least one second source side select gate electrode, at least one second drain side select gate electrode, the plurality of word lines located between the at least one second source side select gate electrode and at least one second drain side select gate electrode, and a plurality of second vertical NAND strings comprising second memory opening fill structures and extending through the at least one second source side select gate electrode, the plurality of word lines and the at least one second drain side select gate electrode;
a first source-select-level dielectric isolation structure located between the at least one first source side select gate electrode and the least one second source side select gate electrode, and contacting a first side of the at least one first source side select gate electrode;
a second source-select-level dielectric isolation structure laterally extending along a first horizontal direction, laterally spaced apart from the first source-select-level dielectric isolation structure along a second horizontal direction, and contacting a second side of the at least one first source side select gate electrode;
a drain-select-level dielectric isolation structure located between the least one first drain side select gate electrode and the least one second drain side select gate electrode, wherein the plurality of word lines extend continuously between the first memory block and the second memory block; and
a first source strip having an areal overlap with the at least one first source side select gate electrode,
wherein each of the first memory opening fill structures and the second memory opening fill structures comprises a respective memory film, a respective drain region, and a respective vertical semiconductor channel having a source-side end contacting a respective source strip;
wherein the first source-select-level dielectric isolation structures directly contacts sidewalls of a subset of the first memory opening fill structures and directly contacts vertical sidewalls of a subset of the second memory opening fill structures; and
wherein each of the source strips is in direct contact with end portions of a plurality of vertical semiconductor channels within the first memory opening fill structures or the second memory opening fill structures, and the source-select-level electrically conductive strips are located between the source strips and the alternating stack.

14. The three-dimensional memory device of claim 13, wherein the first source strip has a lateral extent along the second horizontal direction that is the same as a lateral spacing along the second horizontal direction between the first source-select-level dielectric isolation structure and the second source-select-level dielectric isolation structure.

15. The method of claim 13, wherein sidewalls of the vertical semiconductor channels of the at least two memory opening fill structures and sidewalls of the memory films of the at least two of the memory opening fill structures are in direct contact with a respective sidewall of said one of the source-select-level dielectric isolation structures, the sidewalls of the vertical semiconductor channels of said at least two memory opening fill structures and the sidewalls of the memory films of said at least two memory opening fill structures being parallel to the first horizontal direction.

16. A method of forming a semiconductor structure, comprising:
forming a vertical repetition of unit layer stacks including an insulating layer and a spacer material layer over a sacrificial substrate, wherein the spacer material layers are formed as or are subsequently replaced with electrically conductive layers;
forming openings through the vertical repetition, wherein the openings comprise memory openings and boundary openings;
forming a perforated trench by laterally recessing sidewalls of the spacer material layers around the boundary openings selective to the insulating layers, wherein a row of boundary openings merges at levels of the spacer material layers to form the perforated trench;
forming a perforated dielectric wall structure within the perforated trench;
forming memory opening fill structures in the memory openings, wherein each of the memory opening fill structures comprises a memory film and a vertical semiconductor channel;
replacing the sacrificial substrate with a source layer such that the source layer is in direct contact with the vertical semiconductor channels of the memory opening fill structures;
dividing the source layer into source strips laterally extending along a first horizontal direction and laterally spaced apart along a second horizontal direction that is perpendicular to the first horizontal direction;
dividing a subset of the spacer material layers into source-select-level spacer material strips prior to formation of the memory openings or after dividing the source layer into the source strips; and
forming source-select-level dielectric isolation structures within volumes between neighboring pairs of the source-select-level spacer material strips such that one of the source-select-level dielectric isolation structures is in direct contact with vertical sidewalls of at least two of the memory opening fill structures upon formation of the memory opening fill structures and the source-select-level dielectric isolation structures, wherein each of the source strips is in direct contact with end portions of a plurality of vertical semiconductor channels within the memory opening fill structures, and the source-select-level electrically conductive strips are located between the source strips and the alternating stack.

17. The method of claim 16, further comprising forming source-select-level dielectric isolation structures by depositing a dielectric material within trenches formed between the source strips during the step of dividing the subset of the spacer material layers into the source-select-level spacer material strips.

18. The method of claim 16, wherein:
the perforated trench includes a laterally-extending cavity laterally extending along the first horizontal direction and laterally bounded by a pair of laterally-undulating sidewalls having vertically straight and laterally convex sidewall segments that are adjoined among one another at each level of the spacer material layers; and
the perforated trench includes a row of cylindrical cavity segments at each level of the insulating layers.

19. The method of claim 16, further comprising:
forming memory-side metal interconnect structures embedded in memory-side dielectric material layers over the memory opening fill structures to form a memory die, wherein the memory die comprises memory-side bonding pads located in or on the memory-side dielectric material layers;
providing a logic die comprising a peripheral circuit configured to operate memory elements within the memory opening fill structures and logic-side metal interconnect structures embedded in logic-side dielectric material layers, wherein the logic die comprises logic-side bonding pads located in or on logic-side dielectric material layers; and
bonding the logic die to the memory die such that the logic-side bonding pads are bonded to a respective one of the memory-side bonding pads,
wherein the sacrificial substrate is replaced with the source layer after bonding the logic die to the memory die.

20. The method of claim 16, wherein:
the spacer material layers comprise a semiconductor material; and
the electrically conductive layers are formed by metallization of the semiconductor material into a metal-semiconductor alloy by introducing at least one metallic element into the spacer material layers through the memory openings and inducing formation of the metal-semiconductor alloy by performing a thermal anneal process.

* * * * *